(12) United States Patent
Ishinabe

(10) Patent No.: US 10,674,637 B2
(45) Date of Patent: Jun. 2, 2020

(54) COOLING DEVICE, COOLING SYSTEM, AND COOLING METHOD FOR ELECTRONIC CIRCUITRY

(71) Applicant: FUJITSU LIMITED, Kawasaki-shi, Kanagawa (JP)

(72) Inventor: Minoru Ishinabe, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 45 days.

(21) Appl. No.: 16/013,184

(22) Filed: Jun. 20, 2018

(65) Prior Publication Data
US 2019/0008077 A1 Jan. 3, 2019

(30) Foreign Application Priority Data

Jun. 30, 2017 (JP) .................................. 2017-129560

(51) Int. Cl.
*H05K 7/20* (2006.01)

(52) U.S. Cl.
CPC ..... *H05K 7/20781* (2013.01); *H05K 7/20154* (2013.01); *H05K 7/20236* (2013.01); *H05K 7/20263* (2013.01); *H05K 7/20272* (2013.01); *H05K 7/20736* (2013.01); *H05K 7/20836* (2013.01)

(58) Field of Classification Search
CPC ....................... H05K 7/20236; H05K 7/20763
See application file for complete search history.

(56) References Cited

U.S. PATENT DOCUMENTS

2014/0218858 A1* 8/2014 Shelnutt .................. G06F 1/206
361/679.31

FOREIGN PATENT DOCUMENTS

| JP | 07-091788 | 4/1995 |
| JP | 10-318874 | 12/1998 |
| JP | 2010-226771 | 10/2010 |

* cited by examiner

*Primary Examiner* — James Wu
*Assistant Examiner* — Hung Q Dang
(74) *Attorney, Agent, or Firm* — Fujitsu Patent Center

(57) ABSTRACT

A cooling device includes, a liquid immersion tank having an opening in a top thereof, in which an electronic circuitry including a heat generating circuit is immersed in a second coolant, a lid fitted into the opening, and a cooler, into which a cooled first coolant is input through a first pipe, and from which the first coolant is output through a second pipe, the cooler being located between a liquid level of the second coolant and a lower surface of the lid that faces the liquid level.

19 Claims, 17 Drawing Sheets

FIG. 9A
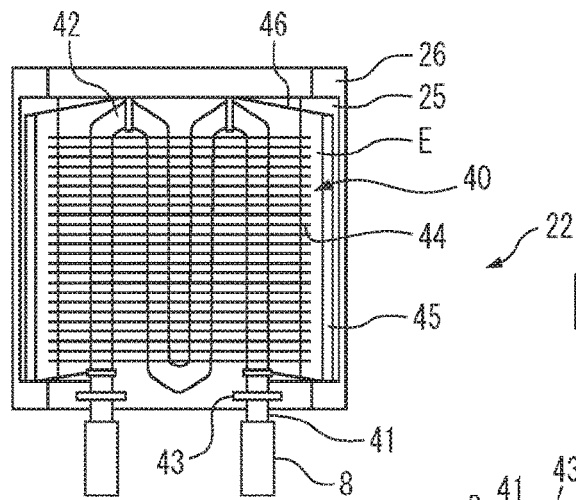
FIG. 9C
FIG. 9B
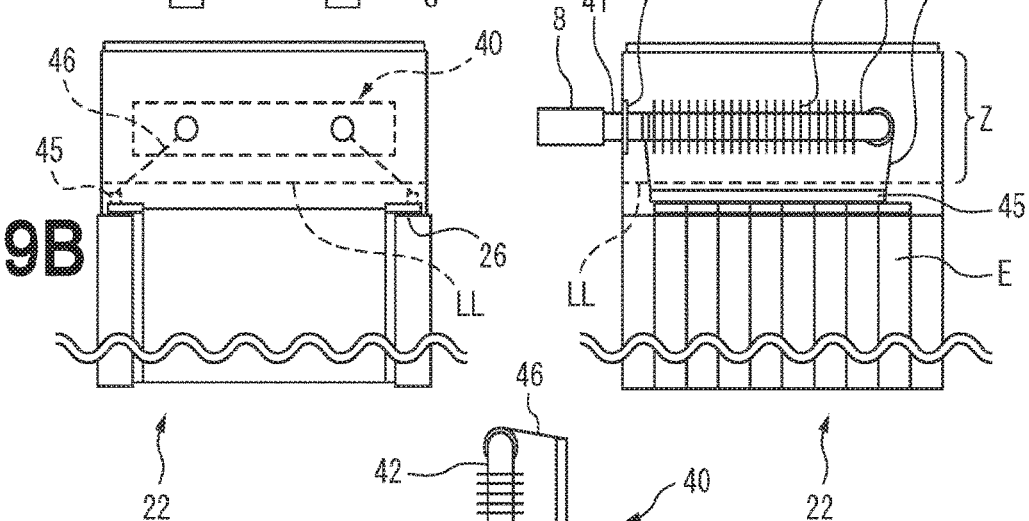
FIG. 9D
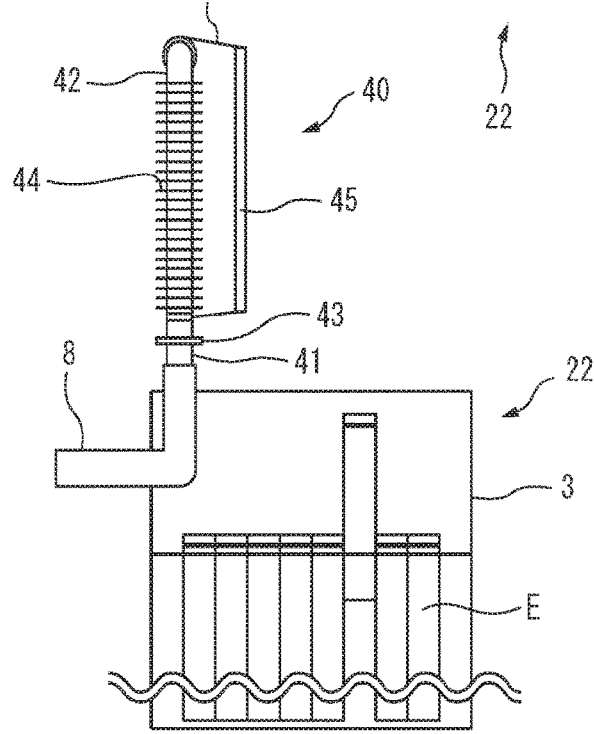

FIG. 11A
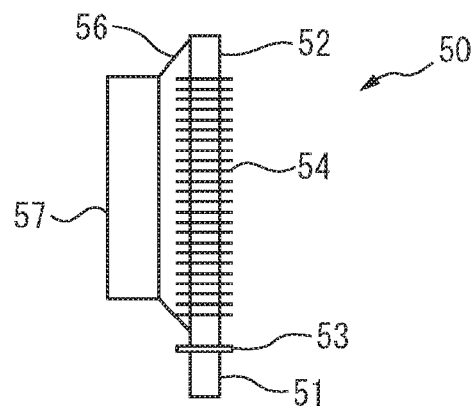
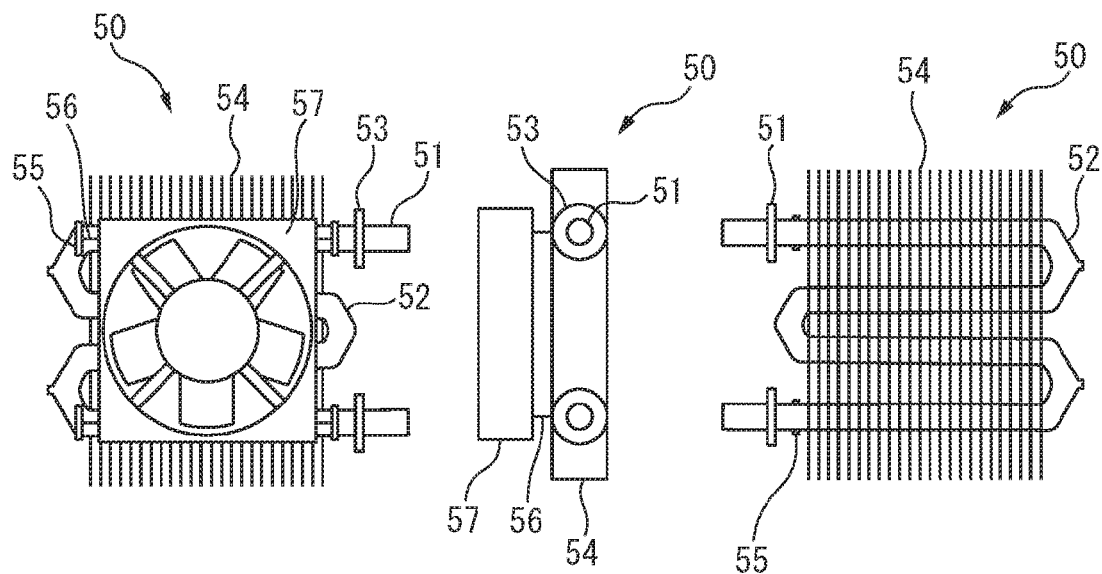
FIG. 11B
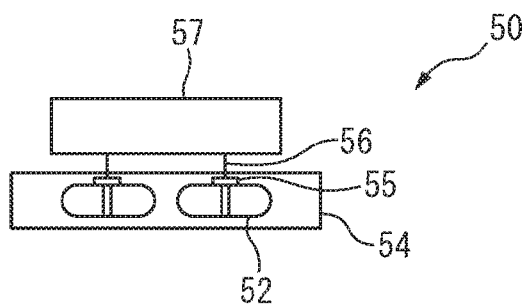

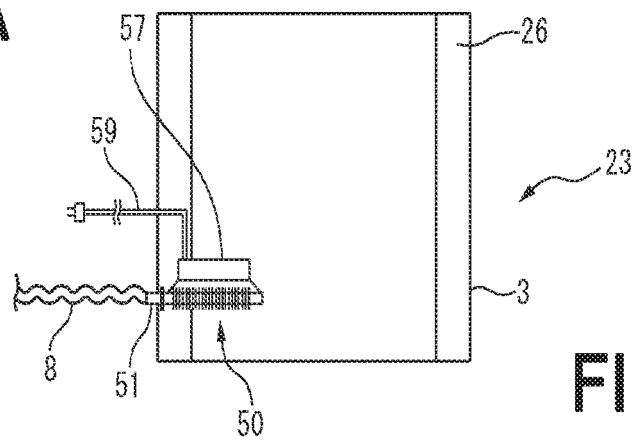
FIG. 12A
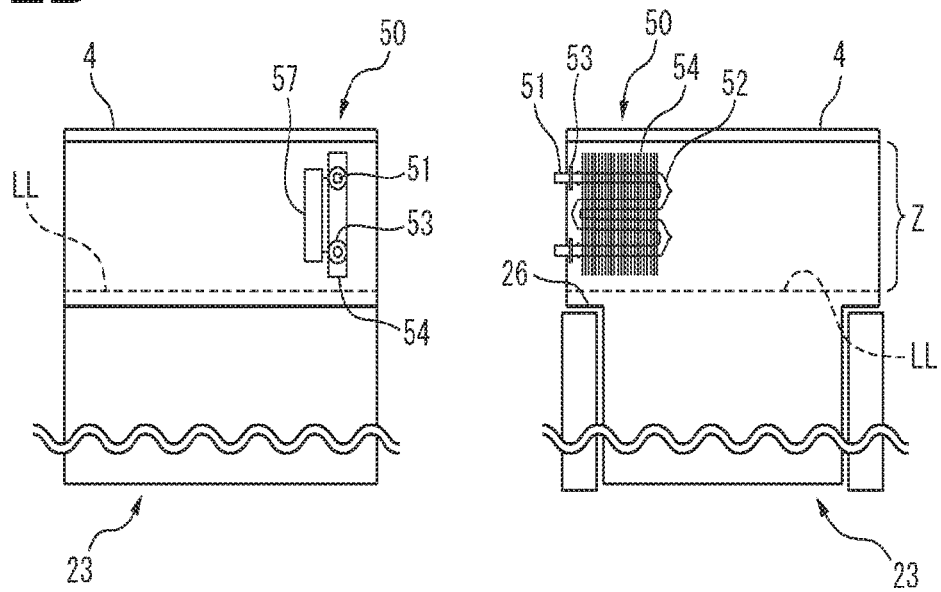
FIG. 12B
FIG. 12C
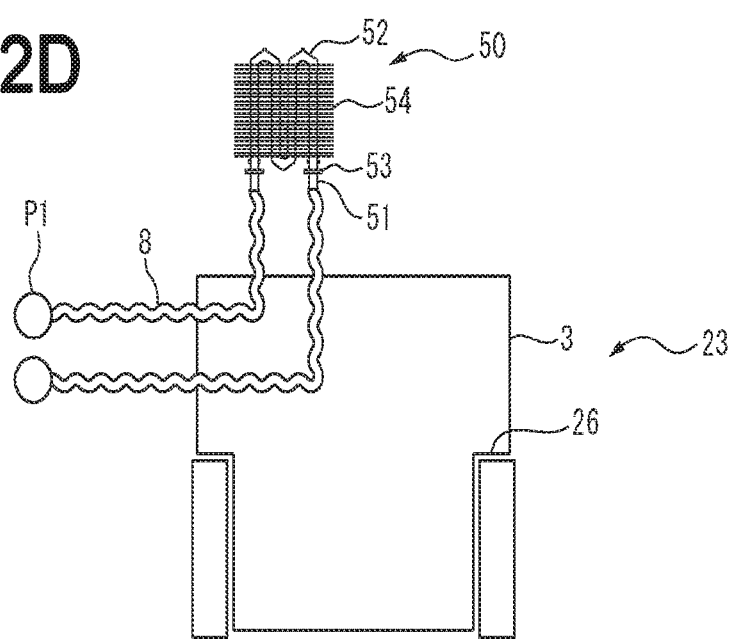
FIG. 12D

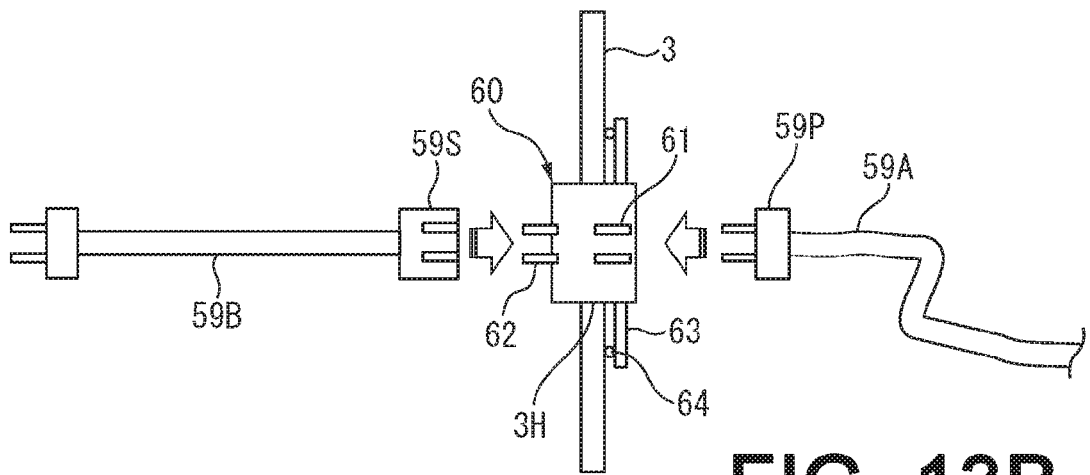
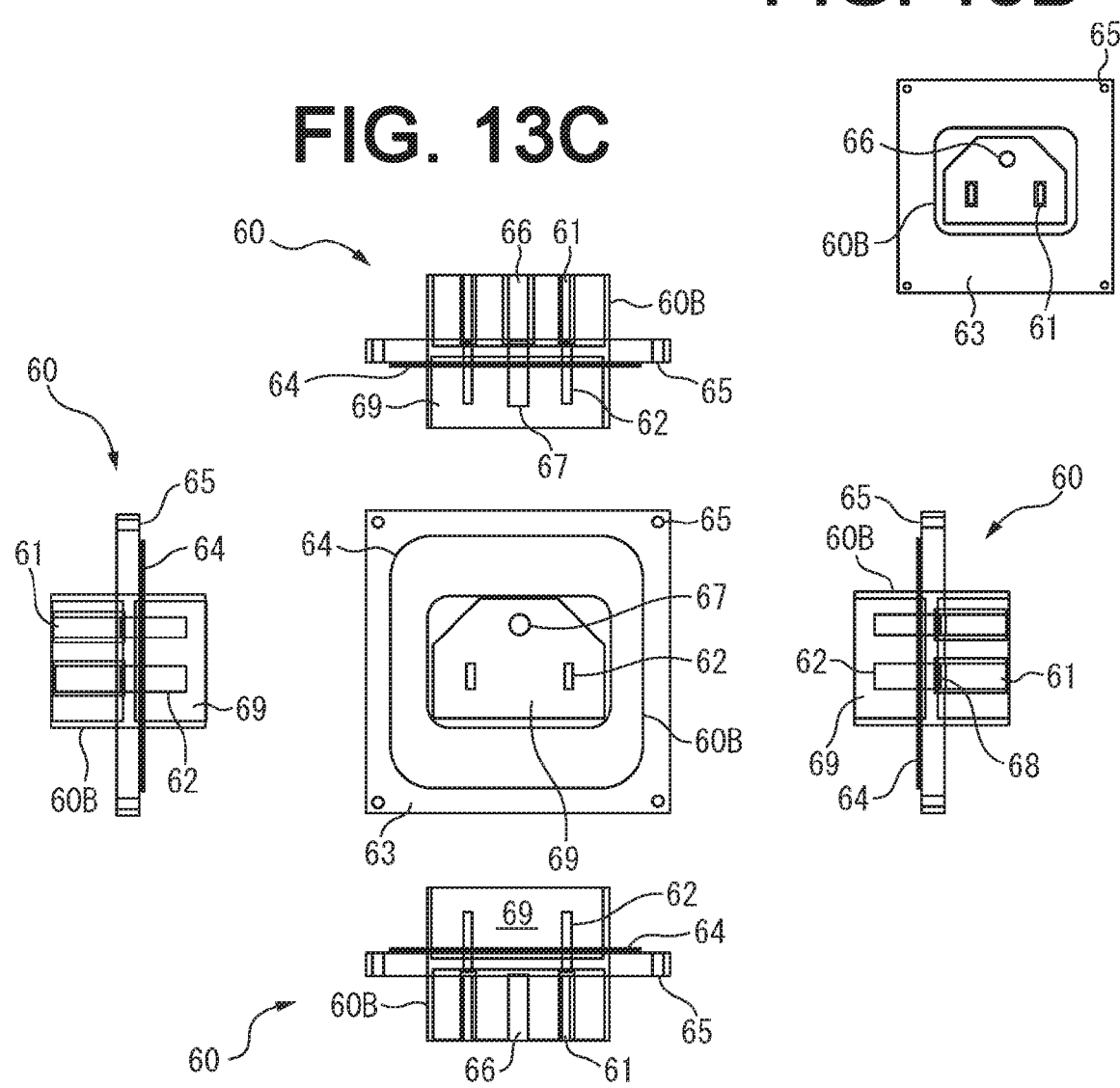

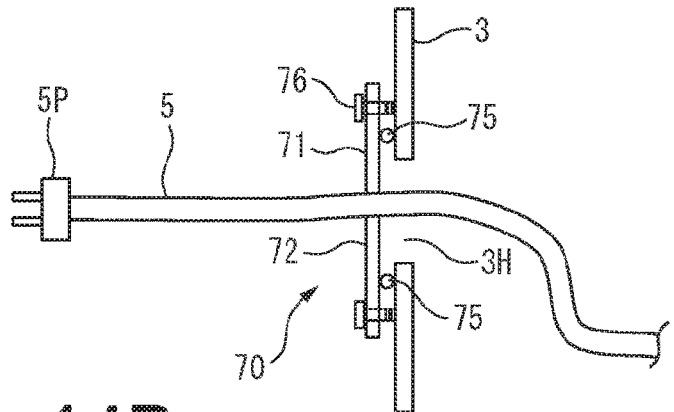
FIG. 14A
FIG. 14D
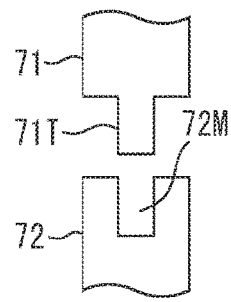
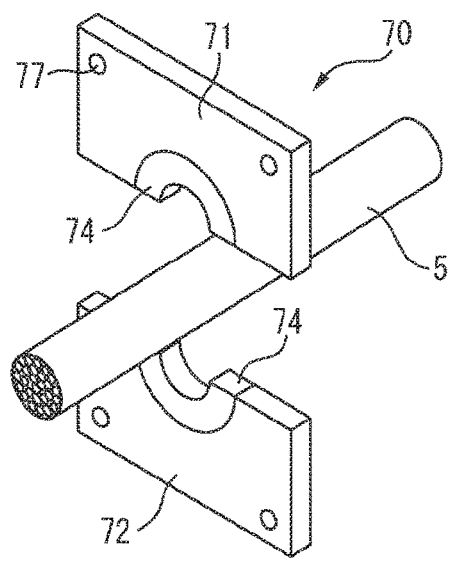
FIG. 14B
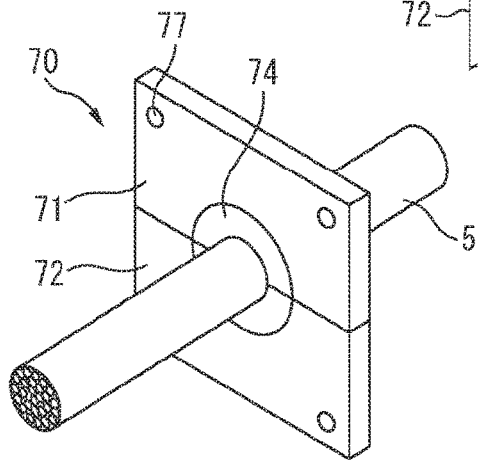
FIG. 14C
FIG. 14E
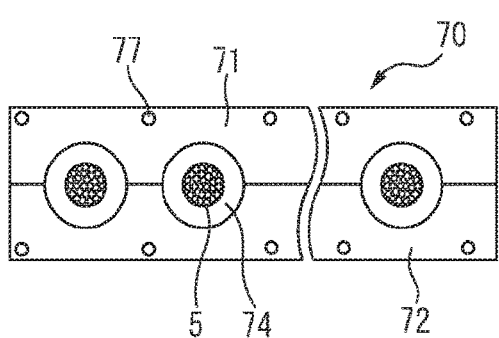
FIG. 14F
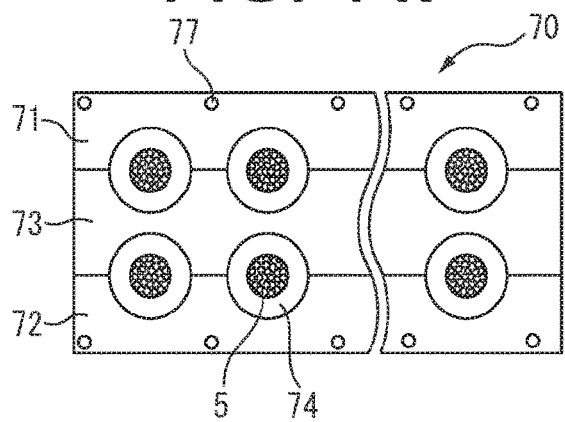

VAPOR PRESSURE OF COOLANT

| TEMPERATURE | 0 | 10 | 15 | 20 | 30 | 40 | 50 | 60 | 70 | 80 | 90 | 100 |
|---|---|---|---|---|---|---|---|---|---|---|---|---|
| VAPOR PRESSURE | 0.0003 | 0.0006 | 0.0011 | 0.0006 | 0.0019 | 0.0032 | 0.0051 | 0.0080 | 0.0122 | 0.0183 | 010267 | 0.0383 |

US 10,674,637 B2

COOLING DEVICE, COOLING SYSTEM, AND COOLING METHOD FOR ELECTRONIC CIRCUITRY

CROSS-REFERENCE TO RELATED APPLICATION

This application is based upon and claims the benefit of priority of the prior Japanese Patent Application No. 2017-129560, filed on Jun. 30, 2017, the entire contents of which are incorporated herein by reference.

FIELD

The embodiments discussed herein are related to a cooling device, a cooling system, and a cooling method for an electronic circuitry.

BACKGROUND

In the related art, liquid immersion cooling is known as a method of cooling a server, which is an electronic circuitry including a heat generating circuit. Liquid immersion cooling is a technique in which a coolant container (hereinafter, referred to as a liquid immersion tank) is filled with a liquid coolant that has electrical insulation and is inert (hereinafter referred to as an "inert coolant") so that the entire server is immersed, and the inert coolant is forcibly circulated using, for example, a pump so that cooling is performed via heat transfer between the server and the inert coolant. As the inert coolant, for example, fluorocarbon (e.g., Fluorinert (registered trademark) manufactured by 3M Company) is adopted, and heat of the server, which is absorbed by the inert coolant, is discharged to the outside of the liquid immersion tank, and is dissipated via an air regulation device or a cooling tower (chiller) at the outside.

FIG. 1A illustrates the structure of a liquid immersion cooling system 10 according to a comparative technique. The liquid immersion cooling system 10 uses an inert coolant L as a coolant of a cooling device 20, which cools an electronic circuitry E by circulating the coolant in a liquid immersion tank 3. The inert coolant L is formed so as to be cooled by another coolant W at the outside of the liquid immersion tank 3. Here, the other coolant is referred to as a first coolant, and the coolant circulated in the liquid immersion tank 3 is referred to as a second coolant. Cooling water is generally used as the first coolant. That is, the liquid immersion cooling system 10 is a system that cools the electronic circuitry E, which includes a heat generating circuit, in an active state (operating state) within the liquid immersion tank 3 by the inert coolant L as the second coolant, which is cooled by the cooling water W as the first coolant. The liquid immersion cooling system 10 includes a chiller 1, which is called a chiller or a cooling tower that cools the cooling water W, a heat exchanger 2 that cools the inert coolant L by performing heat exchange between the cooling water W and the inert coolant L, the liquid immersion tank 3 that accommodates and cools the electronic circuitry E, and a lid 4 that opens and closes an opening 3A in the liquid immersion tank 3.

There are a pipe P1, through which the cooling water W is circulated, between the chiller 1 and the heat exchanger 2 and a pipe P2, through which the inert coolant L is circulated, between the heat exchanger 2 and the liquid immersion tank 3. A pump P is provided in the pipe P2 to forcibly circulate the inert coolant L. The electronic circuitry E, which is cooled by the inert coolant L in the liquid immersion tank 3, is, for example, a server or a storage. A space SP between a liquid level LL of the inert coolant L in the liquid immersion tank 3 of the inert coolant L and the lid 4 is filled with a coolant vapor VL that has evaporated from the liquid level LL of the inert coolant L. In addition, a cable 5 is coupled to the electronic circuitry E, which is accommodated in the liquid immersion tank 3, to perform the supply of power or the transmission/reception of signals. The cable 5 is discharged to the outside of the liquid immersion tank 3 through a cable inlet 6, and is coupled to a control device (not illustrated).

Here, a fluorocarbon-based liquid coolant, which is used as the inert coolant L, evaporates when it is left to stand in the atmosphere. From the viewpoint of stable management of the liquid immersion cooling system, it is important to suppress the amount of coolant that is vaporized and diffused into the atmosphere, in order to suppress the management cost due to replenishment of an expensive fluorine-based coolant.

Related techniques are disclosed in, for example, Japanese Laid-Open Patent Publication Nos. 2010-226771, 10-318874, and 07-091788.

SUMMARY

According to an aspect of the embodiments, a cooling device includes, a liquid immersion tank having an opening in a top thereof, in which an electronic circuitry including a heat generating circuit is immersed in a second coolant, a lid fitted into the opening, and a cooler, into which a cooled first coolant is input through a first pipe, and from which the first coolant is output through a second pipe, the cooler being located between a liquid level of the second coolant and a lower surface of the lid that faces the liquid level.

The object and advantages of the disclosure will be realized and attained by means of the elements and combinations particularly pointed out in the claims. It is to be understood that both the foregoing general description and the following detailed description are exemplary and explanatory and are not restrictive of the disclosure, as claimed.

BRIEF DESCRIPTION OF DRAWINGS

FIGS. 4A to 4C illustrate examples of connection between an inlet/outlet pipe of the cooler illustrated in FIGS. 3A and 3B and a flexible tube coupled thereto, in which FIG. 4A is a structural view of an embodiment using a hose band, FIG. 4B is a structural view of an embodiment using a threaded joint, and FIG. 4C is a structural view of an embodiment using a coupler;

FIG. 9A is a plan view of a state where the server and the cooler are inserted in the cooling device of the second embodiment of the liquid immersion cooling system disclosed here, FIG. 9B is a front view of the cooling device illustrated in FIG. 9A, FIG. 9C is a side view of the cooling device illustrated in FIG. 9B, and FIG. 9D is a side view illustrating a state where the lid is opened for the inspection of the electronic circuitry in the cooling device illustrated in FIG. 9C;

FIG. 11A is a five-sided view illustrating the structure of an embodiment of a cooler used for a cooling device of the liquid immersion cooling system illustrated in FIG. 10, and FIG. 11B is a rear view of the cooler illustrated in FIG. 11A;

FIG. 12A is a plan view illustrating a state where the cooler is inserted into an inner wall of the cooling device of the third embodiment of the liquid immersion cooling system disclosed here, FIG. 12B is a front view of the cooling device illustrated in FIG. 12A, FIG. 12C is a right side view of the cooling device illustrated in FIG. 12A, and FIG. 12D is a side view illustrating a state where a lid is opened for the inspection of an electronic circuitry in the cooling device illustrated in FIG. 12C;

FIG. 13A is a partial cross-sectional view illustrating an embodiment of a connector used for a power cord of the cooler in the cooling device disclosed here, FIG. 13B is a rear view illustrating an embodiment of the connector illustrated in FIG. 13A viewed from the inside of the liquid immersion tank, and FIG. 13C is a five-sided view of the connector illustrated in FIG. 13B;

FIG. 14A is a partial cross-sectional view illustrating an embodiment of the structure of penetrating a communication cable through the liquid immersion tank in the cooling device disclosed here, FIG. 14B is an assembled perspective view illustrating a state of fitting the cable into a cable attachment plate used for the penetrating structure illustrated in FIG. 14A, FIG. 14C is a perspective view illustrating a state where the cable is fitted into the cable attachment plate illustrated in FIG. 14B, FIG. 14D is a partially enlarged cross-sectional view illustrating another structure of a coupling portion of the cable attachment plate illustrated in FIG. 14C, FIG. 14E is a front view of an embodiment of the cable attachment plate, through which a plurality of cables may penetrate, and FIG. 14F is a front view of another embodiment of the cable attachment plate, through which a plurality of cables may penetrate;

DESCRIPTION OF EMBODIMENTS

Figure 1A:
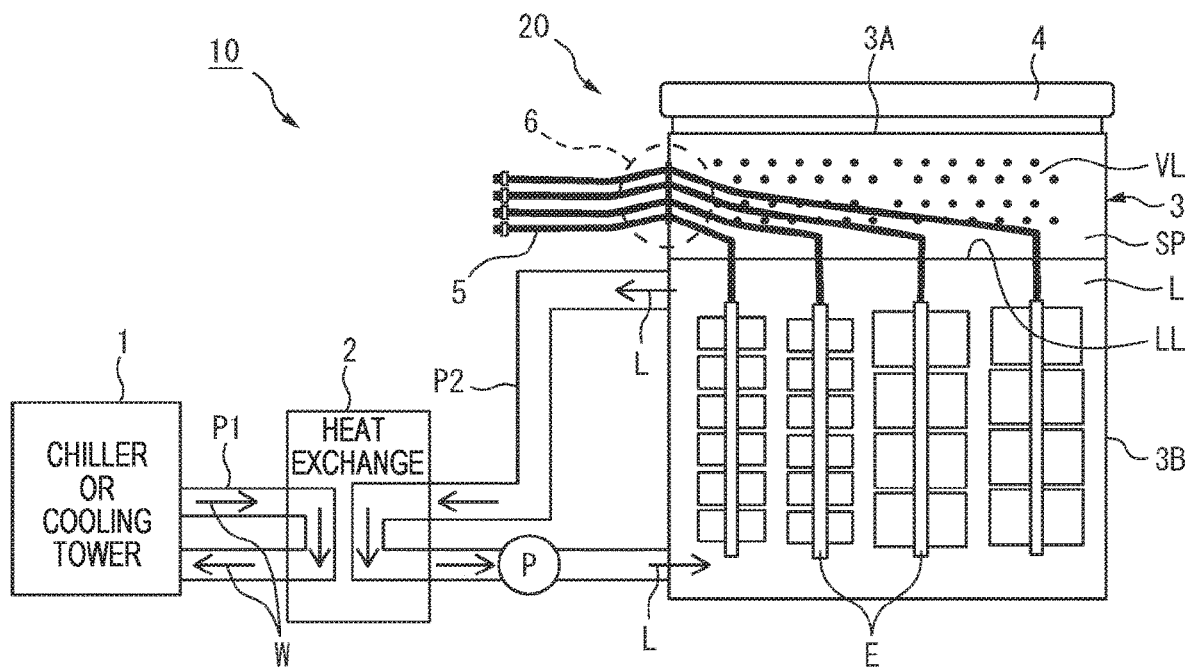
FIG. 1A is a structural view illustrating the structure of a liquid immersion cooling system according to a comparative technique.
Figure 1B:
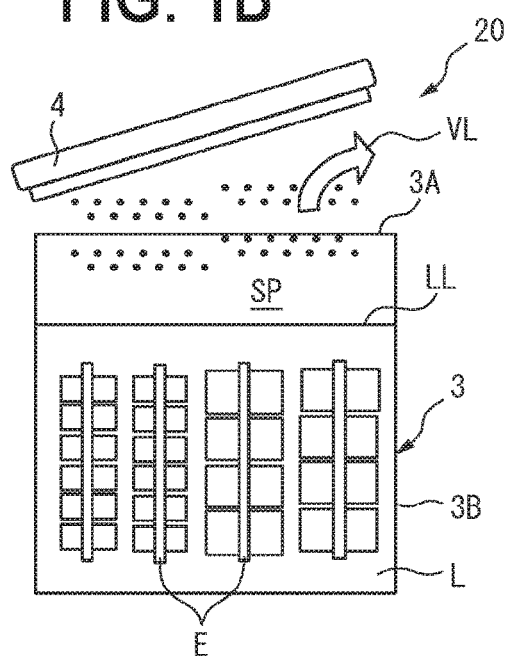
FIG. 1B is an explanatory view illustrating a state when a lid of a liquid immersion tank illustrated in FIG. 1A is opened.
Figure 1C:
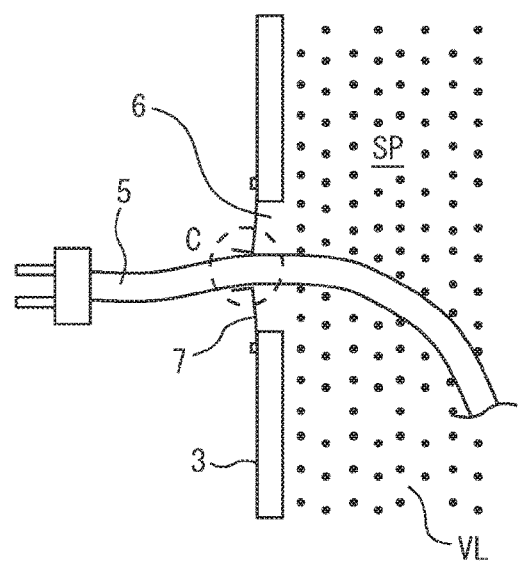
FIG. 1C is a partial cross-sectional view illustrating an example of the structure of a cable inlet of FIG. 1A.

However, in the liquid immersion cooling system 10 of the comparative technique, as illustrated in FIG. 1B, when the lid 4 of the liquid immersion tank 3 is opened for, for example, maintenance work, the coolant vapor VL, which has evaporated from the liquid level LL of the inert coolant L and has drifted in the space SP, may outflow from the opening 3A to the outside of the liquid immersion tank 3. In addition, the vapor amount of the coolant vapor VL, collected in the space SP, becomes the maximum at the saturated vapor pressure. In addition, as illustrated in FIG. 1C, the coolant vapor VL floating in the space SP outflows to the outside from a gap C in a heat sink material 7, which is provided in the cable inlet 6 of the power-supply or communication cable 5.

The amount of evaporation of the inert coolant L depends on the liquid temperature of the inert coolant L, the area of the opening 3A in the liquid immersion tank 3, and the time during which the lid 4 is left open. Then, in the liquid immersion cooling system that requires long-term reliability, an inert coolant of a high density grade (a relatively small amount of evaporation) is adopted in order to suppress the amount of evaporation of the coolant. However, since a high load is applied to the pump, the inert coolant of a high density grade causes high power consumption of the liquid immersion cooling system. In addition, since the inert coolant of a high density grade has a high coolant price, the operational cost becomes high when a large amount of the inert coolant outflows from the liquid immersion tank.

Hereinafter, the embodiments discussed herein will be described in detail based on specific embodiments with reference to the accompanying drawings. In addition, in the embodiments described below, the same reference numerals will be given to the same or similar elements as those of the liquid immersion cooling system of the comparative technique described above, and in order to facilitate understanding, the scale of the drawings are appropriately changed.

Figure 2A:
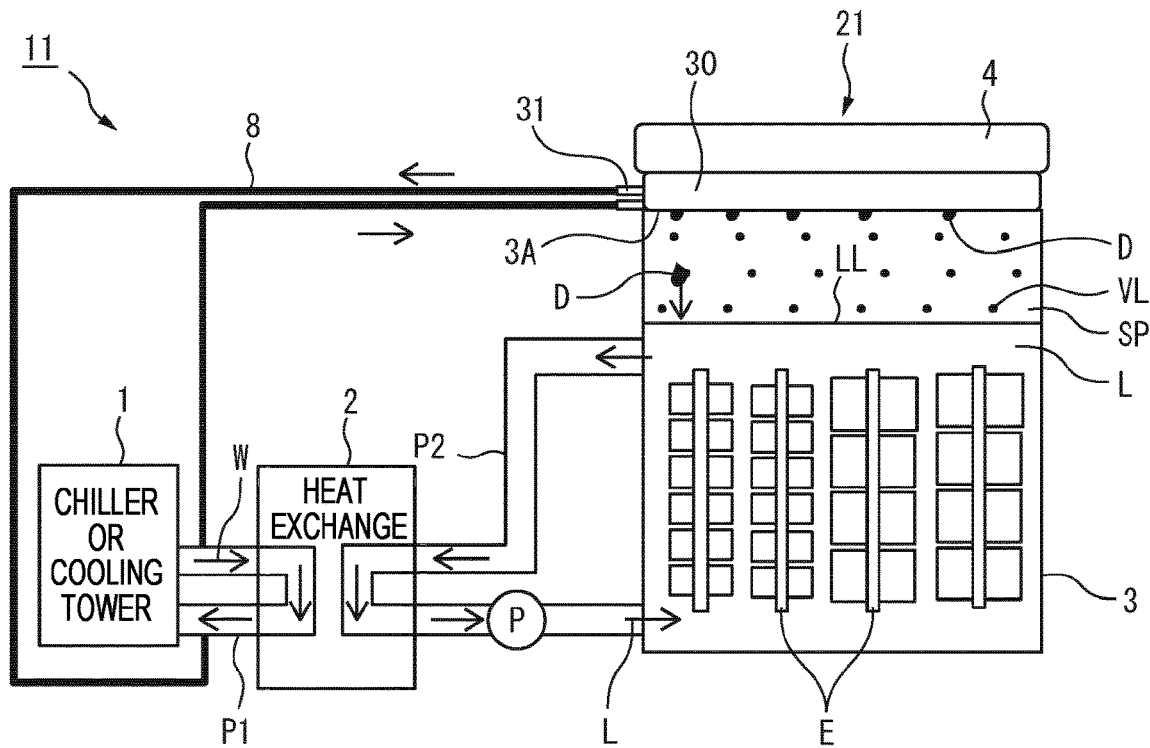
FIG. 2A is a structural view illustrating the structure of a first embodiment of a liquid immersion cooling system disclosed here.

FIG. 2A is a structural view illustrating the structure of a liquid immersion cooling system 11 according to a first embodiment disclosed here. A basic structure of the liquid immersion cooling system 11 according to the first embodiment is the same as that of the liquid immersion cooling system 10 of the comparative technique illustrated in FIG.

1A, and includes the chiller 1, the heat exchanger 2, and the liquid immersion tank 3. The chiller 1 cools the cooling water W as a first coolant, and the cooling water W is supplied to the heat exchanger 2 through the pipe P1 to cool the inert coolant L, which is a second coolant, by performing heat exchange with the inert coolant L. The inert coolant L, cooled in the heat exchanger 2, flows through the pipe P2 so as to be circulated between the heat exchanger 2 and the liquid immersion tank 3 by the pump P. The electronic circuitry E is accommodated in the liquid immersion tank 3. The electronic circuitry E is cooled in an active state (operating state) by the inert coolant L.

The liquid immersion cooling system 11 of the first embodiment differs from the liquid immersion cooling system 10 of the comparative technique in the structure of a cooling device 21, which cools the electronic circuitry E by circulating the inert coolant. In the cooling device 20 of the liquid immersion cooling system 10 of the comparative technique, only the lid 4, which is capable of opening and closing the opening 3A, is provided for the opening 3A in the top of the liquid immersion tank 3. Meanwhile, the cooling device 21 in the liquid immersion cooling system 11 of the first embodiment is provided, on the lower surface of the lid 4, with a cooler 30, which cools the space SP between the lid 4 and the liquid level LL of the inert coolant L in the liquid immersion tank 3. The cooler 30 is a condenser that functions to cool the space SP, to condense the coolant vapor VL of the inert coolant L floating in the space SP into water droplets D, and to return the same to the inert medium L. Therefore, when the space SP is cooled by the cooler 30 before the lid 4 is opened, the amount of the coolant vapor VL of the inert medium L that escapes when the lid 4 is opened may be suppressed. When there are, for example, a small number of cables inside the space SP and a sufficient vacant space between the lid 4 and the liquid level LL, the cooler 30 may have a size enough to cover the liquid level LL.

Figure 2B:
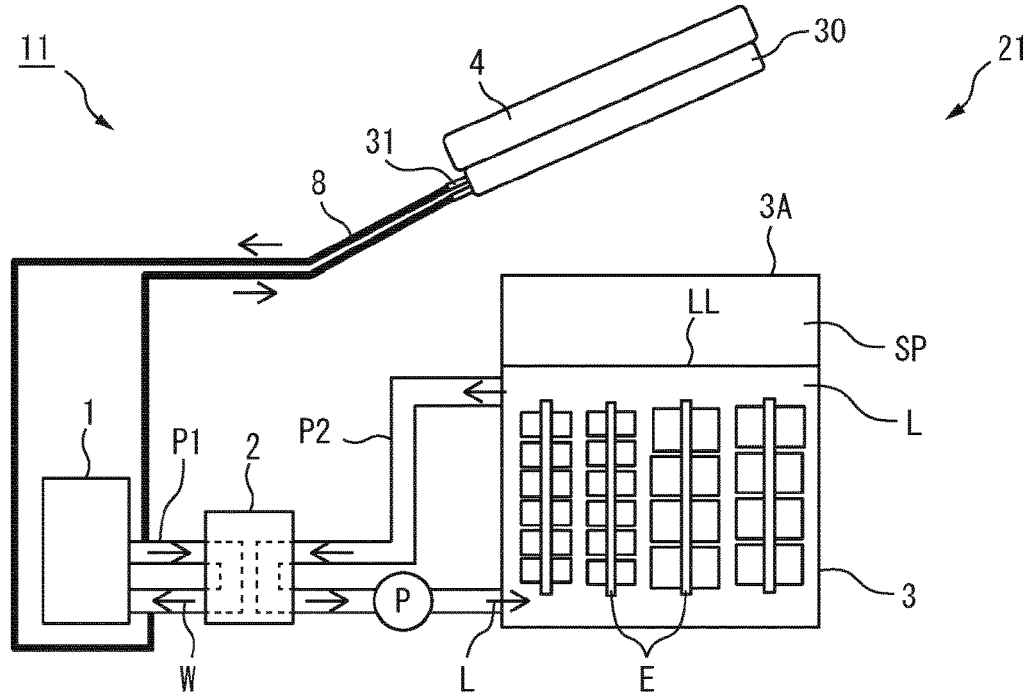
FIG. 2B is a structural view illustrating a state where a lid is opened for the inspection of an electronic circuitry in the liquid immersion cooling system illustrated in FIG. 2A.

A third pipe to be described later is provided within the cooler 30, and an inlet/outlet pipe 31 coupled to the third pipe is coupled to the pipe P1, which is provided between the chiller 1 and the heat exchanger 2, by a flexible tube 8. The flexible tube 8 includes a first pipe, which is branched from the pipe P1 directed to the heat exchanger 2 and inputs the first coolant to the inlet/outlet pipe 31, and a second pipe, which outputs the first coolant to the pipe P1 directed from the inlet/outlet pipe 31 to the heat exchanger 2. Thus, the cooling water W, which is the first coolant of the liquid immersion cooling system 11, is circulated in the cooler 30. As described above, since the cooler 30 is coupled to the pipe P1 by the flexible tube 8, as illustrated in FIG. 2B, the cooler 30 may move together with the lid 4 when the lid 4 is opened. In addition, it is not necessary to always operate the cooler 30, and an opening/closing valve may be provided in the middle of the flexible tube 8, so that the opening/closing valve is opened to circulate the cooling water W to the cooler 30 before a predetermined time at the time of inspection of the electronic circuitry in the liquid immersion tank 3.

Figure 3A:
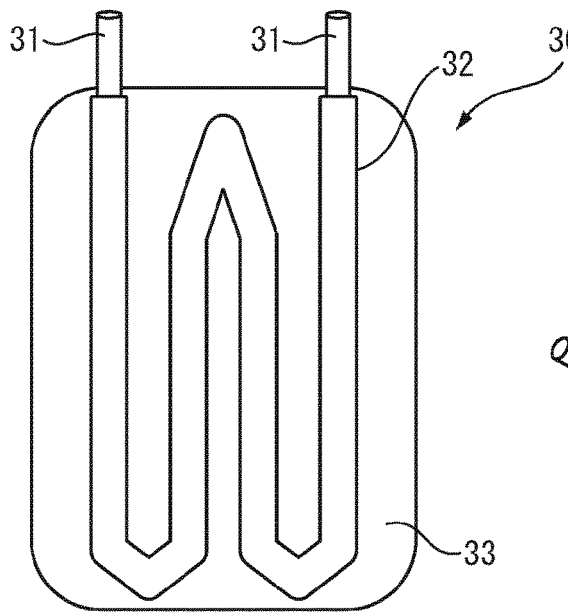
FIG. 3A is a perspective plan view illustrating the structure of an embodiment of a cooler mounted in a cooling device of the liquid immersion cooling system illustrated in FIGS. 2A and 2B.
Figure 3C:
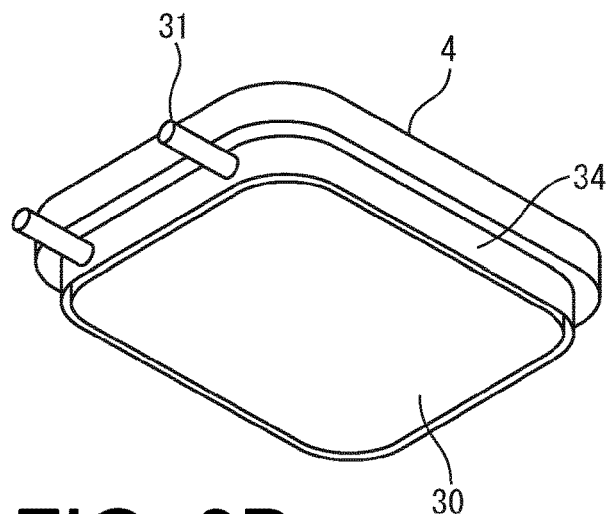
FIG. 3C is a perspective view illustrating a state where the cooler is accommodated inside the lid from the state illustrated in FIG. 3B.
Figure 3B:
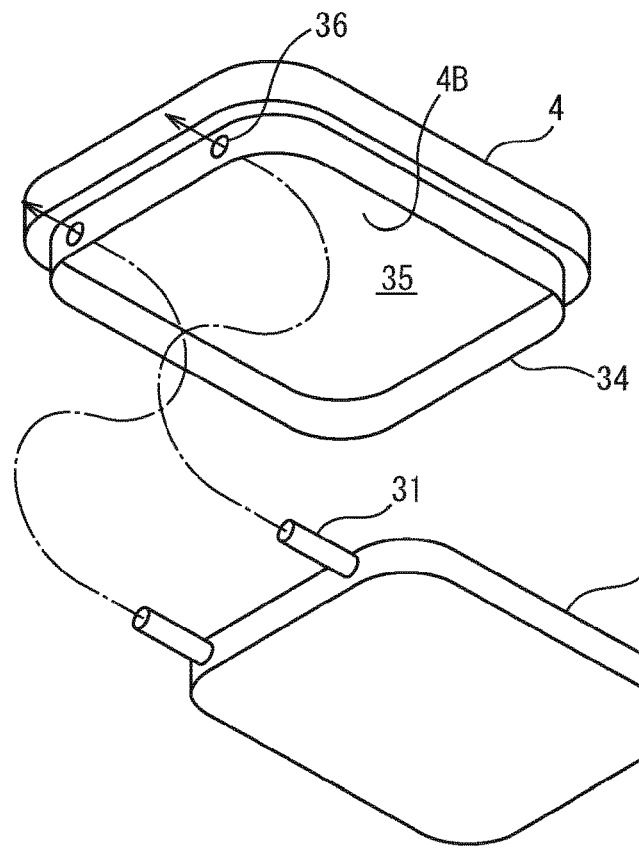
FIG. 3B is an assembled perspective view illustrating a state of accommodating the cooler illustrated in FIG. 3A into the lid.

FIG. 3A is a perspective plan view illustrating the structure of an embodiment of the cooler 30 mounted in the cooling device 21 of the liquid immersion cooling system 11 of the first embodiment illustrated in FIGS. 2A and 2B. A third pipe 32 that meanders is provided within the cooler 30, and inlet/outlet pipes 31 are attached to both ends of the third pipe 32. Then, the third pipe 32 is covered with a heat sink 33. As a specific example, the third pipe 32 and the heat sink 33 may be realized by providing a flow path to an aluminum laminate, which may be formed to have a small thickness. As illustrated in FIG. 3B, a peripheral wall 34 is provided to protrude from the lower surface of the lid 4 so as to be fitted into the opening 3A in the liquid immersion tank 3, and a cavity 35 is formed in a portion surrounded by the peripheral wall 34.

A pipe insertion through-hole 36, through which the inlet/outlet pipe 31 of the cooler 30 is inserted, is provided in one side of the peripheral wall 34 protruding from the lower surface of the lid 4. As illustrated in FIG. 3B, the cooler 30 having the structure illustrated in FIG. 3A may be attached to the cavity 35 by inserting the inlet/outlet pipe 31 through the pipe insertion through-hole 36 and fixing the cooler 30 to the lower surface of the lid 4 using an adhesive or a double-sided tape. FIG. 3C is a perspective view illustrating a state where the cooler 30 is accommodated in the cavity inside the peripheral wall 34 protruding from the lower surface of the lid 4, from the state illustrated in FIG. 3B.

Figure 4A:
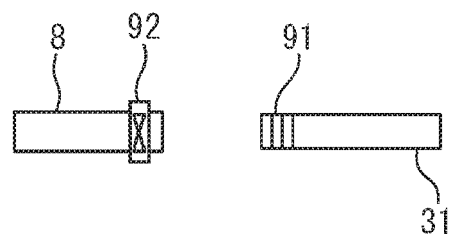
Figure 4B:
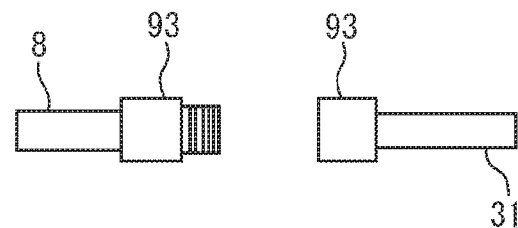
Figure 4C:
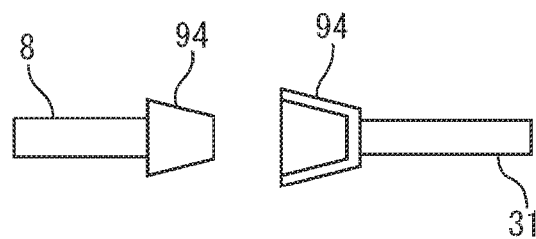

FIGS. 4A to 4C illustrate examples of connection between the inlet/outlet pipe 31 of the cooler 30 illustrated in FIGS. 3A and 3B and the flexible tube 8 coupled to the inlet/outlet pipe 31. In an embodiment illustrated in FIG. 4A, a bamboo shoot fitting 91 is formed on the tip end portion of the inlet/outlet pipe 31, and a hose band 92 is attached to the outer circumferential portion of the flexible tube 8, which is coupled to the inlet/outlet pipe 31. The flexible tube 8 is tightly coupled to the inlet/outlet pipe 31 by tightening the hose band 92 provided on the flexible tube 8 after coupled to the bamboo shoot fitting 91. In an embodiment illustrated in FIG. 4B, a female threaded joint 93 is attached to the tip end portion of the inlet/outlet pipe 31, and a male threaded joint 93 is attached to the tip end portion of the flexible tube 8. In an embodiment illustrated in FIG. 4C, a female coupler 94 is attached to the tip end portion of the inlet/outlet pipe 31, and a male coupler 94 is attached to the tip end portion of the flexible tube 8. Connection between the inlet/outlet pipe 31 and the flexible tube 8 is not limited to these embodiments.

Figure 5A:
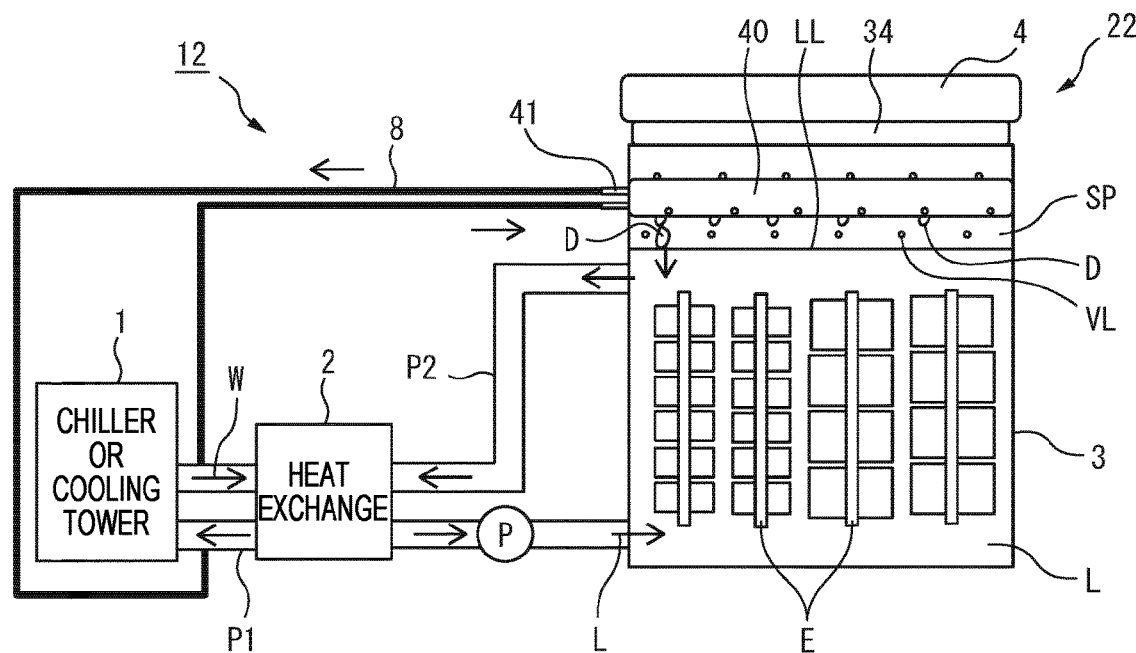
FIG. 5A is a structural view illustrating the structure of a second embodiment of a liquid immersion cooling system disclosed here.

FIG. 5A is a structural view illustrating the structure of a liquid immersion cooling system 12 of a second embodiment disclosed here. A basic structure of the liquid immersion cooling system 12 of the second embodiment is also the same as that of the liquid immersion cooling system 10 of the comparative technique illustrated in FIG. 1A, and includes the chiller 1, the heat exchanger 2, and the liquid immersion tank 3. Then, a cooling device 22 of the liquid immersion cooling system 12 of the second embodiment is provided with a cooler 40, which cools the space SP between the lid 4 and the liquid level LL of the inert coolant L, similarly to the cooler 30 provided in the cooling device 21 of the liquid immersion cooling system 11 of the first embodiment. The cooler 40 in the liquid immersion cooling system 12 of the second embodiment differs from the cooler 30 in the liquid immersion cooling system 11 of the first embodiment in an installation position of the cooler 40 and a structure thereof. First, the installation position of the cooler 40 will be described, and then the difference in structure will be described.

In the liquid immersion cooling system 11 of the first embodiment, the cooler 30 is provided on the lower surface of the lid 4, which opens and closes the opening 3A in the top of the liquid immersion tank 3, but, in the liquid immersion cooling system 12 of the second embodiment, the cooler 40 is located between the lower surface of the lid 4, which opens and closes the opening 3A, and the liquid level LL of the inert coolant L. Similar to the cooler 30, the cooler 40 functions to cool the space SP, to condense the coolant vapor VL of the inert coolant L floating in the space SP into water droplets D, to return the same to the inert medium L, and to suppress the amount of the coolant vapor VL of the inert medium L that escapes when the lid 4 is opened.

Figures 5B, 5C:
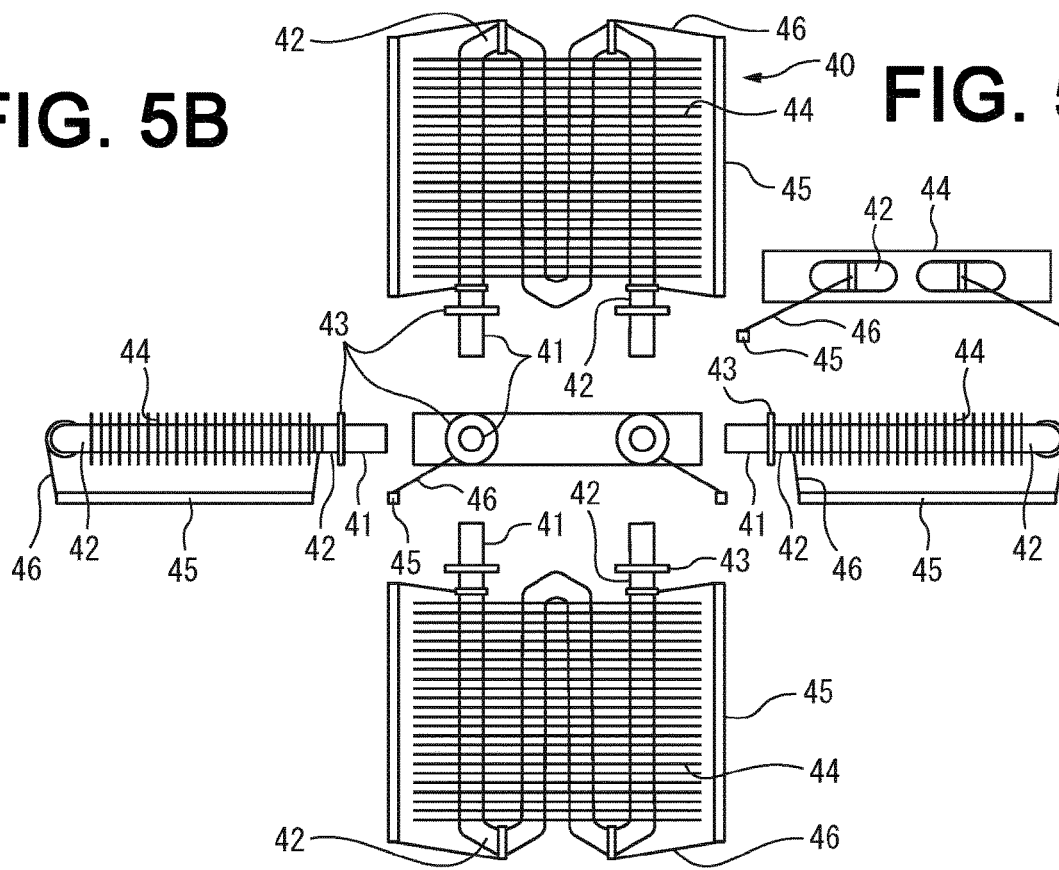
FIG. 5B is a five-sided view illustrating the structure of an embodiment of a cooler used for a cooling device of the liquid immersion cooling system illustrated in FIG. 5A.
FIG. 5C is a rear view of the cooler illustrated in FIG. 5B.

An inlet/outlet pipe 41 provided on the cooler 40 is coupled to the pipe P1, which is provided between the chiller 1 and the heat exchanger 2, by the flexible tube 8. Thus, the cooling water W, which is a first coolant of the liquid immersion cooling system 12, is circulated in the cooler 40. In the cooler 30 in the liquid immersion cooling system 11 of the first embodiment, the third pipe 32 that meanders therein is covered with the heat sink 33. Meanwhile, in the cooler 40 in the liquid immersion cooling system 12 of the second embodiment, as illustrated in FIG. 5B, a fin 44 is provided on the outer circumference of a third pipe 42. The cooler 40 of the second embodiment is also sometimes called a cooling coil.

Figure 6A:
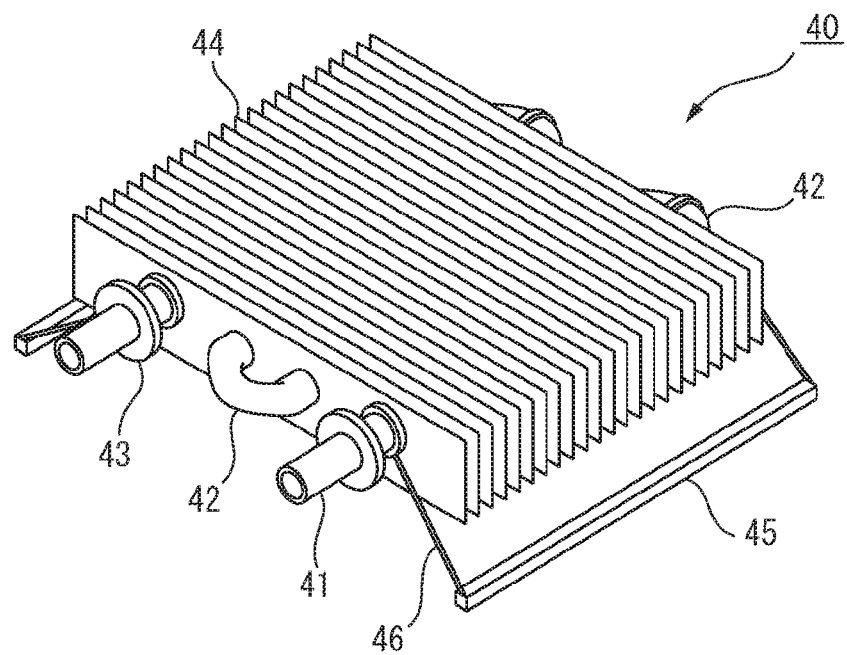
FIG. 6A is a perspective view illustrating the structure of the cooler illustrated in FIGS. 5A to 5C.
Figure 6B:
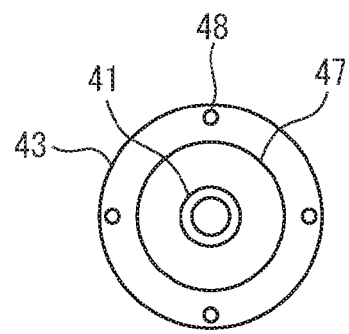
FIG. 6B is an enlarged front view illustrating a fixing plate for fixing the cooler illustrated in FIG. 6A to a liquid immersion tank.

Here, the structure of the cooler 40 in the liquid immersion cooling system 12 of the second embodiment will be described in detail with reference to FIGS. 5B and 5C and FIGS. 6A and 6B. FIG. 5B is a five-sided view illustrating the structure of an embodiment of the cooler 40 illustrated in FIG. 5A, and FIG. 5C is a rear view of the cooler 40 illustrated in FIG. 5B. In addition, FIG. 6A is a perspective view illustrating the structure of the cooler 40, and FIG. 6B is an enlarged front view illustrating a fixing plate 43 provided on the cooler 40 for fixing the cooler 40 to the liquid immersion tank 3.

The cooler 40 is disposed, independently of the lid 4, in a space SP below the lid 4 and above the liquid level LL of the inert coolant L within a body portion 3B of the liquid immersion tank 3. Therefore, the cooler 40 includes the third pipe 42, which is a meandering conduit through which the cooling water W as the first coolant flows, and the fin 44, which is provided on the outer circumferential surface of the third pipe 42. The fin 44 has a plate shape, a plurality of fins 44 is arranged in parallel, and the third pipe 42 penetrates through the fins 44 in a meandering manner. In addition, fixing plates 43 are provided on two inlet/outlet pipes 41 for attaching and fixing the cooler 40 to the inner wall of the liquid immersion tank 3. The third pipe 42 may be formed of a copper pipe or an SUS pipe, and the fins 44 may be formed of aluminum. When there are, for example, a small number of cables inside the space SP and a sufficient vacant space between the lid 4 and the liquid level LL, the cooler 40 may have a size enough to cover the liquid level LL.

In addition, leg parts 46, which hold the third pipe 42 between the fixing plates 43 and the fins 44 and folded portions of the third pipe 42 protruding from the fin 44 on the back side, and a fixing bridge 45, which fixes the leg parts 46 to the liquid immersion tank 3, are provided in pairs on both sides of the cooler 40 with the inlet/outlet pipes 41 as the front. Base portions of two leg parts 46 are fixed to the third pipe 42 between the fixing plates 43 and the fins 44 and fixed to the folded portion of the third pipe 42 protruding from the fin 44 on the back side. Then, both of the two leg parts 46 extend obliquely downward in a direction away from the third pipe 42, and the fixing bridge 45 is provided between tip end portions of the two leg parts 46. The fixing bridge 45 is positioned lower than the bottom side of the fins 44.

The fixing plate 43 has a disc shape, and the inlet/outlet pipe 41 penetrates through a center portion of the fixing plate 43, so that a plurality of screw holes 48 is provided in the vicinity of the outer circumferential portion for attaching the fixing plate 43 to the inner wall of the liquid immersion tank 3 with screws. In addition, an O-ring groove 47 for inserting an O-ring (not illustrated) is provided in the region between the outer circumferential portion of the fixing plate 43 and the inlet/outlet pipe 41, in order to prevent the inert medium L from leaking to the outside when the fixing plate 43 is attached to the inner wall of the liquid immersion tank 3 with screws. When the inlet/outlet pipe 41 and the fixing plate 43 are formed of a copper material, they may be bonded to each other without a gap by welding or brazing, for example.

Figure 7A:
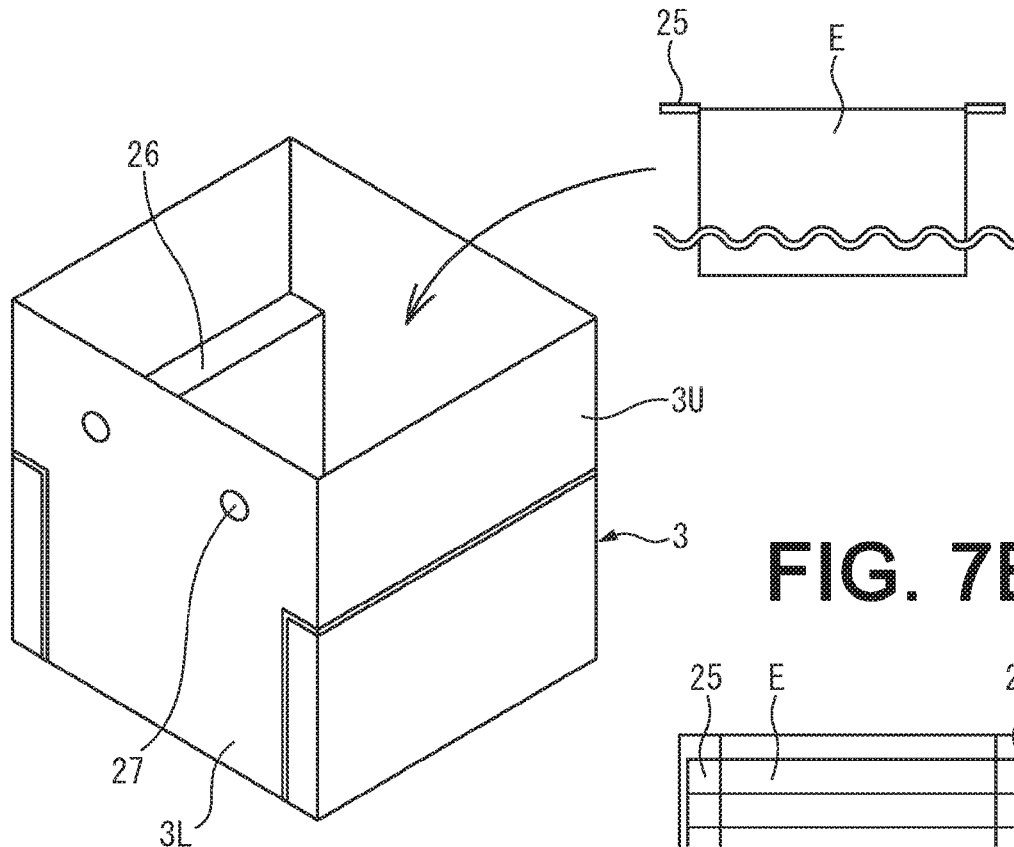
FIG. 7A is an assembled perspective view illustrating the liquid immersion tank used for the cooling device of the second embodiment of the liquid immersion cooling system and a state of inserting a server, held by a suspender, into the liquid immersion tank.

FIG. 7A is an assembled perspective view illustrating the liquid immersion tank 3 used for the cooling device 22 of the second embodiment of the liquid immersion cooling system 12 and a state of inserting an electronic circuitry (server) E, suspended from a suspender 25, into the liquid immersion tank 3. The liquid immersion tank 3 used for the cooling device 22 of the second embodiment includes a lower body 3L and an upper body 3U, and also includes a middle bottom portion 26 at the boundary of the lower body 3L and the upper body 3U inside the liquid immersion tank 3. Both end portions of the suspender 25, which holds the server E, are placed on the middle bottom portion 26, and the server E is suspended inside the lower body 3L. The liquid immersion tank 3 may be formed of, for example, hard polyvinyl chloride (PVC).

Figure 7C:
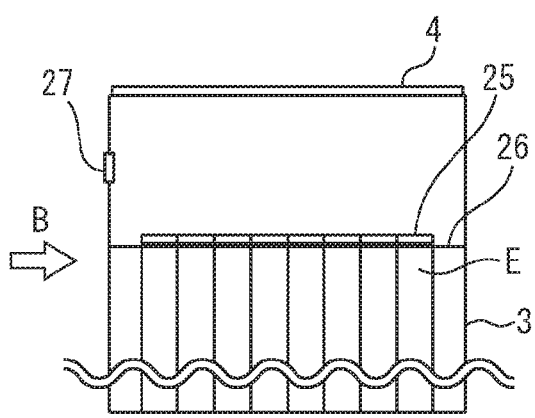
FIG. 7C is a side view of the liquid immersion tank illustrated in FIG. 7B viewed from the direction of arrow A.
Figure 7B:
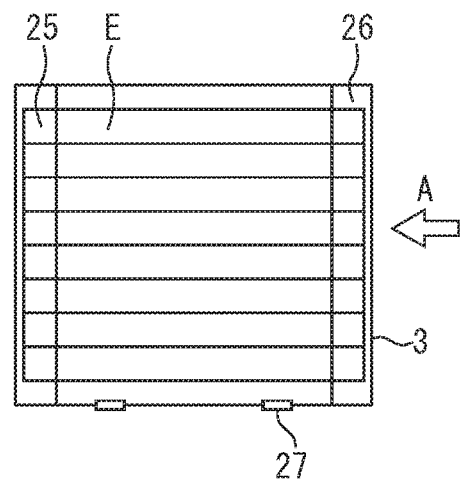
FIG. 7B is a plan view illustrating a state where the server is inserted in the liquid immersion tank illustrated in FIG. 7A.
Figure 7D:
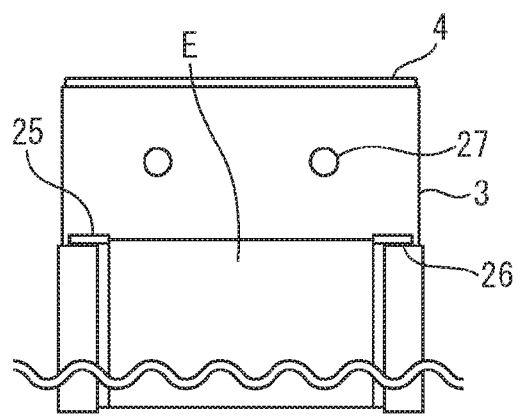
FIG. 7D is a front view of the liquid immersion tank illustrated in FIG. 7C viewed from the direction of arrow B.

FIG. 7B is a plan view illustrating a state where the server E is inserted in the liquid immersion tank 3 illustrated in FIG. 7A, FIG. 7C is a side view of the liquid immersion tank 3 illustrated in FIG. 7B viewed from the direction of arrow A, and FIG. 7D is a front view of the liquid immersion tank 3 illustrated in FIG. 7C viewed from the direction of arrow B. In this manner, a plurality of servers E is accommodated inside the lower body 3L of the liquid immersion tank 3. In addition, a pipe through-hole 27 is provided in one side surface of the upper body 3U for inserting the inlet/outlet pipe 41 of the cooler 40 therethrough.

Figure 8:
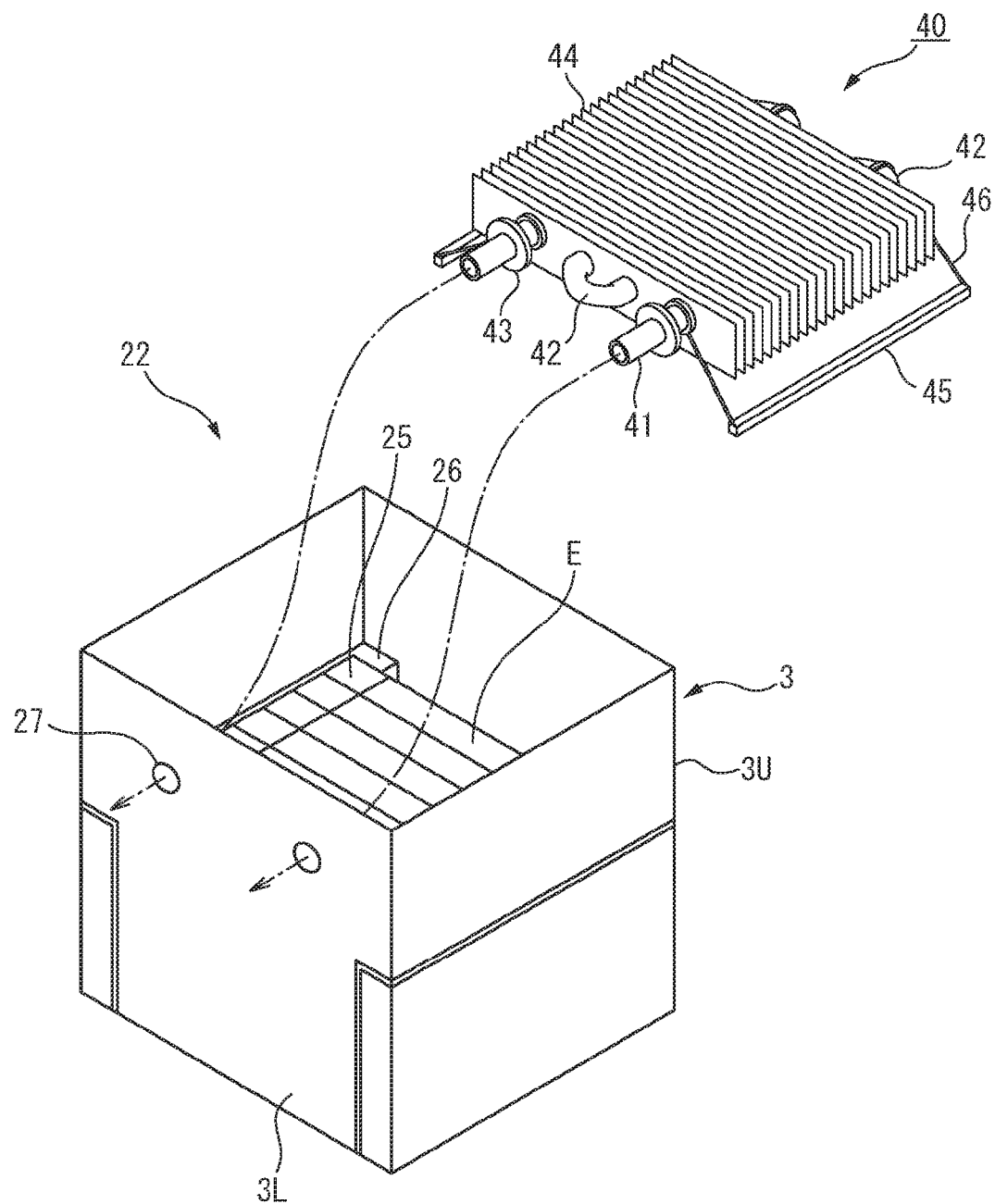
FIG. 8 is an assembled perspective view illustrating a state where a cooler is attached to the liquid immersion tank of the cooling device of the second embodiment of the liquid immersion cooling system disclosed here after the server is inserted into the liquid immersion tank.

FIG. 8 is an assembled perspective view illustrating a state where the cooler 40 is attached after the server E is inserted into the liquid immersion tank 3 of the cooling device 22 of the liquid immersion cooling system 12 of the second embodiment. In the cooler 40, two inlet/outlet pipes 41 are respectively inserted through two pipe through-holes 27 provided in the upper body 3U, and fixed to the upper body 3U by the fixing plates 43. In a state where the cooler 40 is inserted in the liquid immersion tank 3, the fixing bridge 45 of the cooler 40 is placed on the middle bottom portion 26 of the liquid immersion tank 3. The fixing bridge 45 may be fixed to the middle bottom portion 26 of the liquid immersion tank 3 by screwing.

FIG. 9A is a plan view of a state where the server E and the cooler 40 are inserted in the liquid immersion tank 3 of the cooling device 22 of the liquid immersion cooling system 12 of the second embodiment. In addition, FIG. 9B is a front view of the cooling device 22 illustrated in FIG. 9A, and FIG. 9C is a side view of the cooling device 22 illustrated in FIG. 9B. When the cooler 40 is inserted into the liquid immersion tank 3, the cooler 40 may be provided in a range Z within which the cooler does not touch the liquid level LL of the inert medium L and the lid 4. FIG. 9D is a side view illustrating a state where the lid 4 is opened for the inspection of the electronic circuitry E in the cooling device 22 illustrated in FIG. 9C. The inlet/outlet pipe 41 of the cooler 40 is coupled to the pipe P2, through which the cooling water W is circulated, via the flexible tube 8. Therefore, since the flexible tube 8 is elongated when fixing between the fixing plate 43 of the cooler 40 and the liquid immersion tank 3 is released in a state where the lid 4 is open, the cooler 40 may be temporarily retreated upward of the liquid immersion tank 3 to enable implementation of maintenance work.

Figure 10:
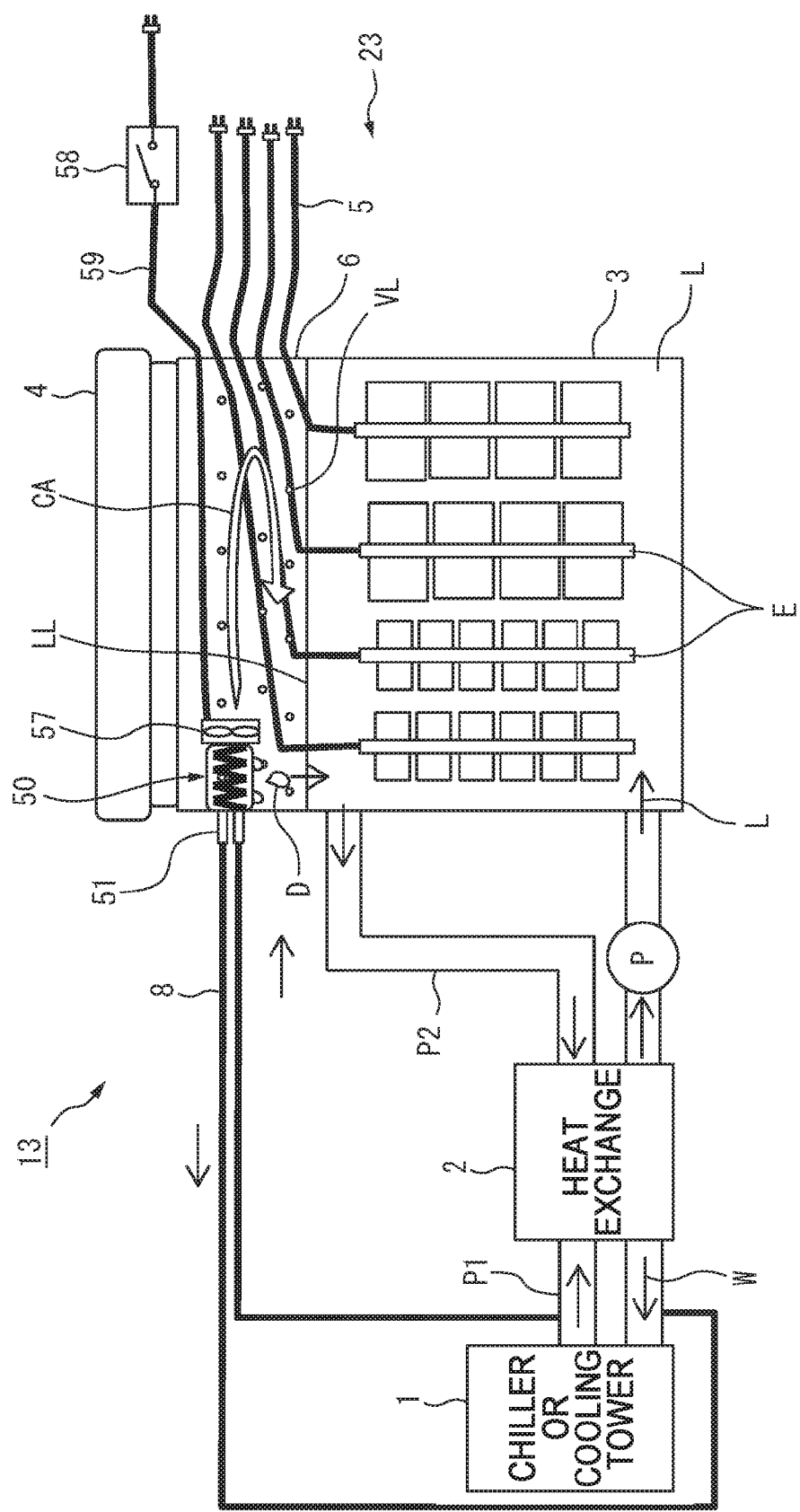
FIG. 10 is a structural view illustrating the structure of a third embodiment of a liquid immersion cooling system disclosed here.

FIG. 10 is a structural view illustrating the structure of a liquid immersion cooling system 13 of a third embodiment disclosed here. A basic structure of the liquid immersion cooling system 13 of the third embodiment is also the same as that of the liquid immersion cooling system 10 of the comparative technique illustrated in FIG. 1A, and includes the chiller 1, the heat exchanger 2, and the liquid immersion tank 3. Then, similarly to the cooler 40 provided in the cooling device 22 of the liquid immersion cooling system 12 of the second embodiment, the cooling device 23 of the liquid immersion cooling system 13 of the third embodiment is provided with a cooler 50, which cools the space SP between the lid 4 and the liquid level LL of the inert coolant L. The cooler 50 in the liquid immersion cooling system 13 of the third embodiment differs from the cooler 40 in the liquid immersion cooling system 12 of the second embodiment in an installation position of the cooler 50 and a structure thereof. First, the installation position of the cooler 50 will be described, and then the difference in structure will be described.

In the liquid immersion cooling system 12 of the second embodiment, the cooler 40 is attached on the middle bottom portion 26 of the liquid immersion tank 3 by the leg parts 46 and the fixing bridge 45 between the lower surface of the lid 4, which opens and closes the opening 3A, and the liquid level LL of the inert coolant L. Meanwhile, in the liquid immersion cooling system 13 of the third embodiment, the cooler 50 is attached to the inner wall portion of the liquid immersion tank 3 between the lower surface of the lid 4, which opens and closes the opening 3A, and the liquid level LL of the inert coolant L. Similarly to the cooler 40, the cooler 50 functions to cool the space SP, to condense the coolant vapor VL of the inert coolant L floating in the space SP into water droplets D, to return the same to the inert medium L, and to suppress the amount of the coolant vapor VL of the inert medium L that escapes when the lid 4 is opened.

In addition, the cooler 50 in the liquid immersion cooling system 13 of the third embodiment is small and lightweight, compared to the cooler 40 in the liquid immersion cooling system 12 of the second embodiment since it is attached to the inner wall portion of the liquid immersion tank 3. Then, in order to efficiently cool the space SP between the lower surface of the lid 4 and the liquid level LL of the inert coolant L with the cooler 50 that is small and lightweight, the cooler 50 includes a fan 57. The cooler 50 of the third embodiment may be applied when there are, for example, many cables of the electronic circuitry E in the space SP and no sufficient vacant space between the lid 4 and the liquid level LL. An inlet/outlet pipe 51 provided in the cooler 50 is coupled to the pipe P1, which is provided between the chiller 1 and the heat exchanger 2, via the flexible tube 8. Thus, the coolant W, which is a first coolant of the liquid immersion cooling system 13, is circulated in the cooler 50.

In addition, a power cord 59 of the fan 57 provided in the cooler 50 in the liquid immersion cooling system 13 of the third embodiment is drawn out to the outside of the liquid immersion tank 3, and then coupled to a power supply via a switch 58. Thus, the fan 57 operates only when the switch 58 is turned on to circulate air CA, cooled by the cooler 50, to the space SP below the lid 4 and above the liquid level LL of the inert coolant L. That is, it is not necessary to always operate the fan 57, and the fan 57 may be operated just before opening the lid 4 at the time of inspection of the electronic circuitry E until the amount of coolant vapor VL in the space SP decreases. In addition, although not illustrated, a solenoid valve, which is interlocked with the on/off of the switch 58, is provided in the middle of the flexible tube 8, and is opened to circulate the cooling water W to the cooler 50 only when the fan 57 is operated.

Here, the structure and the installation position of the cooler 50 in the liquid immersion cooling system 13 of the third embodiment will be described with reference to FIGS. 11A and 11B and FIGS. 12A to 12D. FIG. 11A is a five-sided view illustrating the structure of an embodiment of the cooler 50 used in the cooling device 23 of the liquid immersion cooling system 13 illustrated in FIG. 10, and FIG. 11B is a rear view of the cooler illustrated in FIG. 11A. In addition, FIG. 12A is a plan view illustrating a state where the cooler 50 is inserted into the cooling device 23 of the liquid immersion cooling system 13 of the third embodiment, FIG. 12B is a front view of the cooling device 23 illustrated in FIG. 12A, and FIG. 12C is a right side view of the cooling device 23 illustrated in FIG. 12A. In addition, FIG. 12D is a side view illustrating a state where the lid 4 is opened for the inspection of the electronic circuitry E in the cooling device 23 illustrated in FIG. 12C.

The cooler 50 is disposed on the inner wall surface of the liquid immersion tank 3, which faces the space SP in the range Z below the lid 4 and above the liquid level LL of the inert coolant L inside the body portion 3B of the liquid immersion tank 3. The cooler 50 includes a third pipe 52, which is a meandering conduit through which the cooling water W as a first coolant flows, and a fin 54 provided on the outer circumferential surface of the third pipe 52. The fin 54 has a plate shape, a plurality of fins 54 is arranged in parallel, and the third pipe 52 penetrates through the fins 54 in a meandering manner. In addition, a fixing plate 53 is provided on the inlet/outlet pipe 51 for fixing the cooler 50 to the inner wall surface of the liquid immersion tank 3. The third pipe 52 may be formed of a copper pipe or a SUS pipe, and the fins 54 may be formed of aluminum.

In addition, a fan 57 is provided on one side of a wider side surface among the side surfaces formed by the end surfaces of the fins 54 of the cooler 50 with the inlet/outlet pipe 51 as the front. The fan 57 is provided with four leg parts 56, and fixing bridges 55 are provided on the tip end portions of the leg parts 56. The fixing bridges 55, which are provided on the tip end portions of two leg parts 56 on the inlet/outlet pipe 51 side, are respectively fixed on the third pipe 52 between the fixing plates 53 and the fins 54. The fixing bridges 55, which are provided on the tip end portions of two leg parts 56 on the side opposite to the inlet/outlet pipe 51, are respectively fixed on folded portions of the third pipe 52 projecting from the fin 54 on the back side. The fan 57 is fixed at a position, which is adjacent to the fins 54 of the cooler 50 with a slight distance, by the fixing bridges 55 and the leg parts 56, and the air in the space SP, which passes through the cooler 50, is cooled by wind generated in the fan 57. The direction of rotation of the fan 57 may be either a direction in which the air is directed to the cooler 50 or a direction in which the air is discharged from the cooler 50.

The fixing plate 53, provided on the inlet/outlet pipe 51 of the cooler 50, has a disk shape, similar to the fixing plate 43 provided in the cooler 40 of the second embodiment illustrated in FIG. 6B. Thus, although not illustrated, the inlet/outlet pipe 51 penetrates through a center portion of the fixing plate 53, and a plurality of screw holes is provided in the vicinity of the outer circumferential portion for attaching the fixing plate 53 to the inner wall surface of the liquid immersion tank 3 with screws. In addition, similarly, an O-ring groove for inserting an O-ring (not illustrated) may be provided in the region between the outer circumferential portion of the fixing plate 53 and the inlet/outlet pipe 51, in order to prevent the inert medium L from leaking to the outside when the fixing plate 53 is attached to the inner wall surface of the liquid immersion tank 3 with screws. The inlet/outlet pipe 51 and the fixing plate 53 may be formed of the same material.

The cooler 50 having the structure described above is attached to the inner wall surface of the liquid immersion tank 3 illustrated in FIGS. 12A to 12C via the fixing plate 53 with screws in the range Z within which the cooler 50 does not touch both the lid 4 and the liquid level LL of the inert coolant L. Then, as illustrated in FIG. 12A, the inlet/outlet pipe 51 is coupled to the pipe P1 by the flexible tube 8, and a power cord 59 is coupled to a power supply (illustration of the switch is omitted). When the cooling water is circulated in the cooler 50 and the fan 57 is operated in a state where the cooler 50 is attached to the inner wall surface of the liquid immersion tank 3, the space SP is cooled by the cold air that outflows from the cooler 50, and the amount of the coolant vapor VL of the inert medium L in the SP is suppressed.

FIG. 12D is a side view illustrating a state where the lid 4 is opened at the time of inspection of the electronic circuitry E in the cooling device 23 illustrated in FIG. 12C. The inlet/outlet pipe 41 of the cooler 40 is coupled to the pipe P1, through which the cooling water W is circulated, by the flexible tube 8. Therefore, since the flexible tube 8 is elongated when the screws of the fixing plate 53, which fix the cooler 50 to the liquid immersion tank 3, are removed in a state where the lid 4 is open, the cooler 50 may be temporarily retreated upward of the liquid immersion tank 3 to enable implementation of maintenance work. At this time, when the power cord 59 of the fan 57 is configured as illustrated in FIGS. 13A to 13C, it is possible to separate the power cord 59 from the liquid immersion tank 3 in a watertight state.

FIG. 13A is a partial cross-sectional view illustrating an embodiment of a connector 60 of the power cord 59 of the cooler 50 in the cooling device 23 disclosed here. In this case, the power cord 59 may be fitted into the connector 60 and may be divided into an indoor cord 59A and an outdoor cord 59B. Then, a plug 59P is provided on the liquid immersion tank 3 side of the indoor cord 59A, and a socket 59S is provided on the liquid immersion tank 3 side of the outdoor cord 59B. In addition, FIG. 13B is a rear view of the connector 60 illustrated in FIG. 13A viewed from the inside of the liquid immersion tank 3, and FIG. 13C is a five-sided view of the connector 60 illustrated in FIG. 13B.

The connector 60 is provided with a flange-shaped attachment plate 63 on the longitudinal center portion of a columnar body 60B. In the present embodiment, the attachment plate 63 has a rectangular shape, and includes screw holes 65 in four corners thereof. In addition, an annular seal rubber 64 is provided on the surface of the attachment plate 63 that is attached to the inner surface of the liquid immersion tank 3. In addition, a female contact 61 is provided in the body 60B on the inner surface side of the liquid immersion tank 3, a cavity 69 is formed in a portion of the body 60B that protrudes from the liquid immersion tank 3, and a male contact 62 is provided in the cavity 69. A guide hole 66 is provided in the vicinity of the female contact 61, and a guide pin 67 is provided in the vicinity of the male contact 62. This corresponds to a case where the plug 59P and the socket 59S, which are provided on the end portions of the indoor cord 59A and the outdoor cord 59B, are 3 pins.

Next, the penetrating structure in a case where the cable 5 of the electronic circuitry E is drawn out from the liquid immersion tank 3 in a watertight manner will be described with reference to FIGS. 14A to 14F. FIG. 14A is a partial cross-sectional view illustrating an embodiment of the structure of penetrating the communication cable 5 through the liquid immersion tank 3 in the cooling device. The communication cable 5 may penetrate through the liquid immersion tank 3 in a watertight manner by a cable attachment plate 70. The cable attachment plate 70 includes an upper partition plate 71 and a lower partition plate 72, and the communication cable 5 is fitted into the bonding portion of the upper partition plate 71 and the lower partition plate 72 in a watertight state. Then, each of the upper partition plate 71 and the lower partition plate 72 is attached to the outer surface of the liquid immersion tank 3 using screws 76 with an O-ring 75 interposed therebetween. Reference numeral 5P denotes a plug provided on the end portion of the communication cable 5, and is coupled to a control device (not illustrated).

FIG. 14B is an assembled perspective view illustrating an example of a specific structure of the cable attachment plate 70 illustrated in FIG. 14A, and illustrates a state before the communication cable 5 is fitted into the upper partition plate 71 and the lower partition plate 72. A circular recess is formed in the bonding portion of the upper partition plate 71 and the lower partition plate 72, and a semicircular buffer material, which has an inner diameter smaller than an outer diameter of the communication cable 5, for example, a rubber 74 is accommodated in the circular recess. Reference numeral 77 denotes a screw hole. FIG. 14C is a perspective view illustrating a state where the cable is fitted into the upper partition plate 71 and the lower partition plate 72 illustrated in FIG. 14B, and the end surfaces of the upper partition plate 71 and the lower partition plate 72 are bonded to each other using an adhesive. At this time, when a protrusion 71T is provided on the end surface on the bonding side of the upper partition plate 71 and a groove 72M is provided in the end surface on the bonding side of the lower partition plate 72, an adhesive may be unnecessary when bonding the upper partition plate 71 and the lower partition plate 72 to each other.

FIG. 14E is a front view of another embodiment of the cable attachment plate 70, through which a plurality of cables 5 may penetrate. The cable attachment plate 70 of the present embodiment is formed to include the upper partition plate 71 and the lower partition plate 72. FIG. 14F is a front view of another embodiment of the cable attachment plate 70, through which a plurality of cables 5 may penetrate. The cable attachment plate 70 of the present embodiment is formed to include an intermediate partition plate 73 between the upper partition plate 71 and the lower partition plate 72. When the communication cable 5 penetrates through the liquid immersion tank 3 by using the cable attachment plate 70 having the above-described structure, leakage of the inert medium from the cable inlet of the communication cable 5 of the electronic circuitry E may be suppressed. In addition, since no connector is provided in this structure, this structure may cause no noise in the communication cable, and may also be applied to a high-speed communication cable.

Figure 15A:
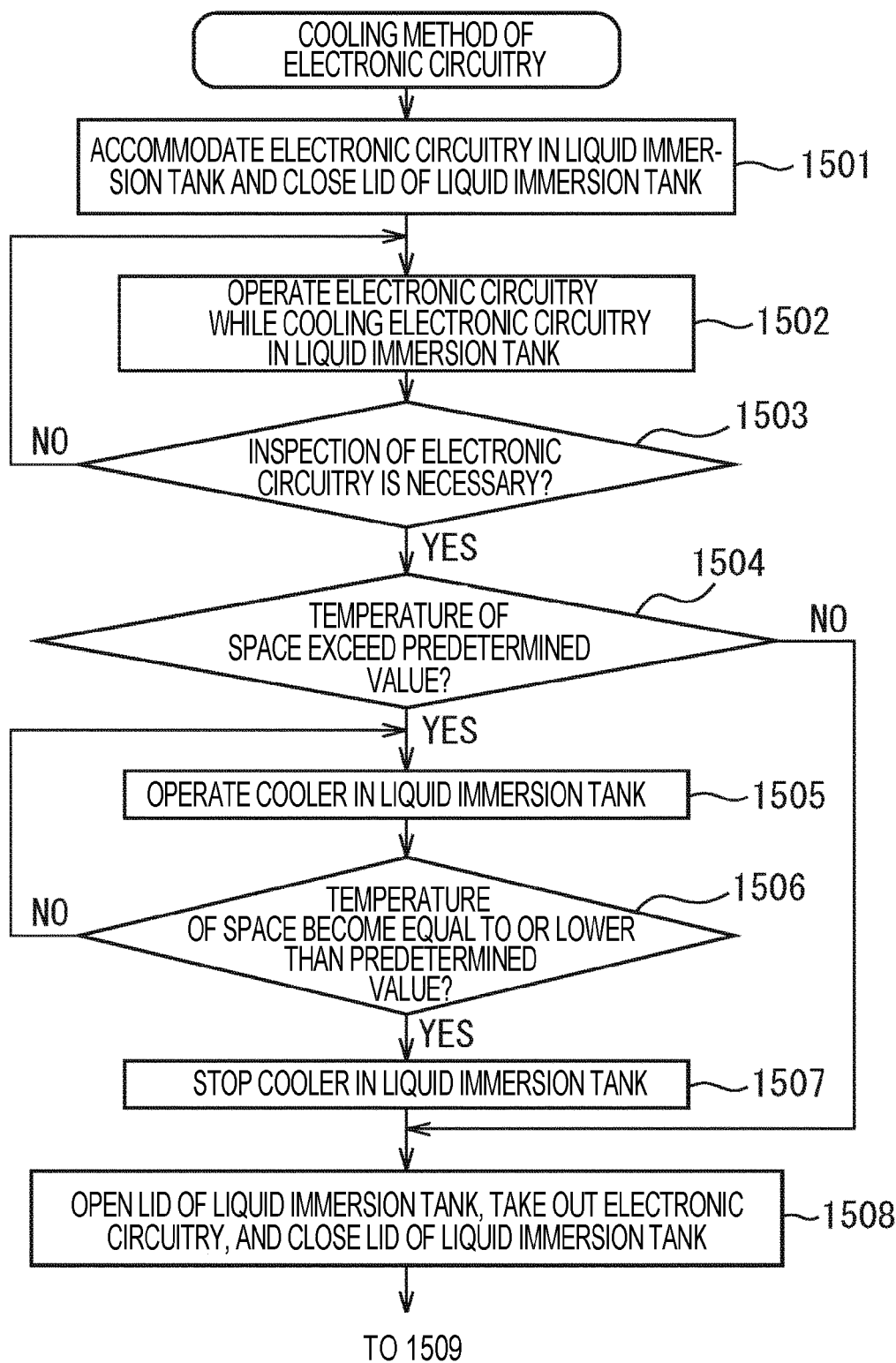
FIGS. 15A and 15B are flowcharts illustrating an exemplary control sequence of a method of cooling an electronic circuitry using a cooling system disclosed here.
Figure 15B:
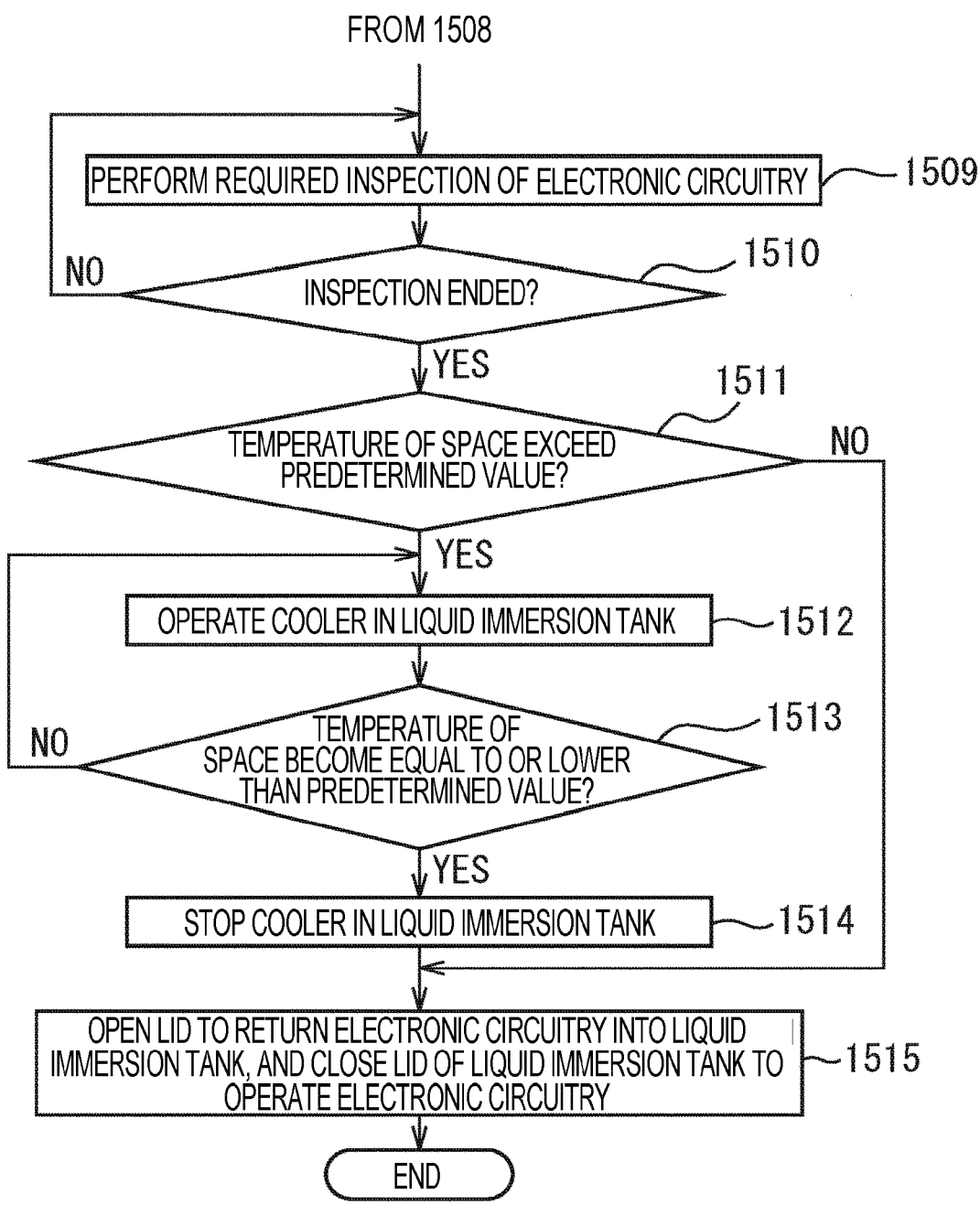

FIGS. 15A and 15B are flowcharts illustrating an exemplary control sequence at the time of inspection of an electronic circuitry in a method of cooling the electronic circuitry for cooling the electronic circuitry in a liquid immersion tank by using any one of the liquid immersion cooling systems 11, 12, and 13 of the first to third embodiments described above.

When cooling the electronic circuitry in the liquid immersion tank, in step 1501, the electronic circuitry is accommodated in the liquid immersion tank and immersed in an inert coolant, and thereafter, the lid of the liquid immersion tank is closed. As illustrated in the above-described embodiment, there is a space between the liquid level of the inert coolant within the liquid immersion tank and the lid of the liquid immersion tank. Then, in this state, in step 1502, the electronic circuitry is operated while being cooled in the liquid immersion tank using the inert coolant. In the following step 1503, it is determined whether or not the inspection of the electronic circuitry is necessary. A case where the inspection of the electronic circuitry is necessary is, for example, a case where a problem occurs in the electronic circuitry or a periodical examination after a predetermined time has passed. Usually, the determined result of step 1503 is "NO" so that the method returns to step 1502, and the electronic circuitry is continuously operated while the electronic circuitry is cooled with the inert coolant in the liquid immersion tank.

Meanwhile, when the determined result of step 1503 is "YES", the method proceeds to step 1504. In step 1504, it is determined whether or not the temperature of the space in the liquid immersion tank exceeds a predetermined value. When the temperature of the space in the liquid immersion tank exceeds the predetermined value, the method proceeds to step 1505. However, when the temperature of the space in the liquid immersion tank does not exceed the predetermined value, the method proceeds to step 1508. In step 1505 to which the method proceeds when the temperature of the space in the liquid immersion tank exceeds the predetermined value, the cooler in the liquid immersion tank is operated, and the air of the space in the liquid immersion tank is cooled so that the temperature thereof is lowered.

In the following step 1506, it is determined whether or not the air of the space in the liquid immersion tank is cooled and the temperature thereof has become equal to or lower than the predetermined value. Then, when the temperature of the air of the space in the liquid immersion tank has not become equal to or lower than the predetermined value, the method returns to step 1505, and a processing of cooling the air of the space in the liquid immersion tank to lower the temperature of the air is continued. When it is determined in step 1506 that the temperature of the air of the space in the liquid immersion tank has become equal to or lower than the predetermined value, the method proceeds to step 1507 to stop the operation of the cooler in the liquid immersion tank, and then process to step 1508.

In step 1508, the lid of the liquid immersion tank is opened, the electronic circuitry that needs to be inspected is discharged, and the lid of the liquid immersion tank is closed. At this time, since the air of the space in the liquid immersion tank is equal to or lower than the predetermined temperature, the outflow of vapor of the inert coolant from the space in the liquid immersion tank is suppressed. After the electronic circuitry is discharged, the method proceeds to step 1509, and the required inspection of the electronic circuitry is performed. In the following step 1510, it is determined whether or not the inspection of the discharged electronic circuitry has ended. When the inspection of the electronic circuitry has not ended (NO), the method returns to step 1509 to continue the inspection of the electronic circuitry. When the inspection of the electronic circuitry has ended (YES), the method proceeds to step 1511.

In step 1511, it is determined whether or not the temperature of the space in the liquid immersion tank exceeds a predetermined value. When the temperature of the space in the liquid immersion tank exceeds the predetermined value, the method proceeds to step 1512. However, when the temperature of the space in the liquid immersion tank does not exceed the predetermined value, the method proceeds to step 1515. In step 1512 to which the method proceeds when the temperature of the space in the liquid immersion tank exceeds the predetermined value, the cooler in the liquid immersion tank is operated, and the air of the space in the liquid immersion tank is cooled so that the temperature thereof is lowered.

In the following step 1513, it is determined whether or not the air of the space in the liquid immersion tank is cooled and the temperature of the air has become equal to or lower than a predetermined value. Then, when the temperature of the air of the space in the liquid immersion tank has not become equal to or less than the predetermined value, the method returns to step 1512 and a processing of cooling the air of the space in the liquid immersion tank to lower the temperature of the air is continued. When it is determined in step 1513 that the temperature of the air of the space in the liquid immersion tank has become equal to or lower than the predetermined value, the method proceeds to step 1514 to stop the operation of the cooler in the liquid immersion tank, and then proceeds to step 1515.

In step 1515, the lid of the liquid immersion tank is opened so that the electronic circuitry is returned into the liquid immersion tank, and thereafter, the lid is closed so that the electronic circuitry, which has been completely inspected, is operated, whereby this routine is ended. Since a state where step 1515 is ended is the same as a state where step 1501 ends, thereafter, the operations from step 1502 to step 1515 are repeated.

Figures 16A, 16B:
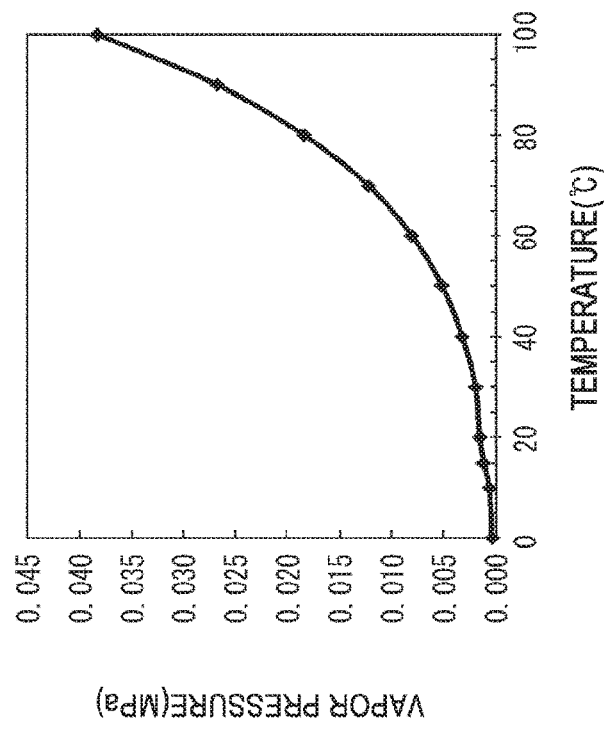
FIG. 16A is a view illustrating a vapor pressure with respect to the temperature of an inert coolant in the internal space of a cooling device disclosed here.
FIG. 16B is a diagram illustrating variation in vapor pressure with respect to the temperature of an inert coolant in the internal space of the cooling device illustrated in FIG. 16A.

FIG. 16A is a view illustrating the vapor pressure (the amount of inert coolant vapor) with respect to the temperature of the inert coolant in the internal space of a cooling device disclosed here, and FIG. 16B is a diagram illustrating variation in vapor pressure with respect to the temperature of the inert coolant in the internal space of the cooling device illustrated in FIG. 16A. In the control described with reference to FIGS. 15A and 15B, the cooler in the liquid immersion tank is operated in step 154, and the air of the space in the liquid immersion tank is cooled. Then, in step 157, it is determined whether or not the temperature of the air in the liquid immersion tank has become equal to or lower than a predetermined value. The predetermined value may be set to about 10° C. (vapor pressure of 0.0006 MPa) based on data illustrated in FIGS. 16A and 16B. Thereby, for example, assuming that the temperature of the air in the liquid immersion tank before the operation of the cooler is 50° C. (vapor pressure of 0.0051 MPa), the outflow of the inert coolant vapor from the inside of the liquid immersion tank when the lid is opened may be suppressed to about $\frac{1}{10}$.

By providing the cooler of the embodiment described above in the liquid immersion tank and making the inlet of the power cord or the cable into the liquid immersion tank airtight, the following effects may be expected.

(1) Stable long-term operation of the system may be realized by suppressing the amount of evaporation of the inert coolant and the leakage amount of the inert coolant from the cable inlet when the lid is opened.

(2) Even an inert coolant of a low density grade that easily evaporates may be adopted. The inert coolant of the low density grade has an advantage of reducing the power of a pump because the coolant has a low density and an advantage of reducing the introduction cost because the coolant is inexpensive.

(3) Since the replenishment amount of the inert coolant is reduced, the operation cost by replenishment may be reduced.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. A cooling device comprising:
   a liquid immersion tank having an opening in a top thereof, in which an electronic circuitry including a heat generating circuit is immersed in a second coolant;
   a lid fitted into the opening; and
   a cooler, into which a first coolant cooled by a chiller is input through a first pipe coupled to the chiller, and from which the first coolant heated in the cooler is output through a second pipe coupled to the chiller, the cooler being located between a liquid level of the second coolant and a lower surface of the lid that faces the liquid level in such a manner that a lower surface of the cooler covers the opening of the liquid immersion tank entirely.

2. The cooling device according to claim 1, wherein the cooler includes a third pipe configured to interconnect the first pipe and the second pipe, and a heat sink provided on the third pipe.

3. The cooling device according to claim 2, wherein the cooler further includes a blower configured to blow air to the heat sink.

4. The cooling device according to claim 2, wherein the heat sink is a fin.

5. The cooling device according to claim 1, wherein the cooler is provided on the lid.

6. The cooling device according to claim 5, wherein the cooler moves together with the lid when the lid is opened.

7. The cooling device according to claim 1, wherein the first coolant is water, and the second coolant is an inert coolant.

8. The cooling device according to claim 1, wherein a body portion of the liquid immersion tank that faces a space is provided with a cable inlet, through which a cable coupled to the electronic circuitry penetrates in an airtight state.

9. The cooling device according to claim 1, wherein the chiller includes a fourth pipe configured to circulate the first coolant cooled by the chiller from the chiller to a heat exchanger and coupled to the first pipe and a fifth pipe configured to circulate the first coolant heated by the heat exchanger from the heat exchanger to the chiller and coupled to the second pipe.

10. A cooling system comprising:
    an electronic circuitry including a heat generating circuit;
    a chiller configured to cool a first coolant;
    a heat exchanger configured to perform heat exchange between the first coolant and a second coolant;
    a liquid immersion tank having an opening in a top thereof, in which the electronic circuitry is immersed in the second coolant;
    a lid fitted into the opening; and
    a cooler, into which the first coolant cooled by the chiller is input through a first pipe coupled to the chiller, and from which the first coolant heated in the cooler is output to the chiller through a second pipe coupled to the chiller, the cooler being located between a liquid level of the second coolant and a lower surface of the lid that faces the liquid level in such a manner that a lower surface of the cooler covers the opening of the liquid immersion tank entirely.

11. The cooling system according to claim 10, wherein the first coolant from the chiller is circulated in the cooler.

12. The cooling system according to claim 10, wherein the cooler is attached to the lower surface of the lid, and includes a third pipe through which the first coolant flows, and a heat sink configured to cover the third pipe, wherein the third pipe is coupled to the chiller, and a pump is provided between the heat exchanger and the liquid immersion tank to move the second coolant.

13. The cooling system according to claim 10, wherein the first pipe is a flexible tube.

14. The cooling system according to claim 10, wherein the second coolant is cooled by the first coolant at an outside of the liquid immersion tank.

15. The cooling system according to claim 10, wherein the chiller includes a fourth pipe configured to circulate the first coolant cooled by the chiller from the chiller to the heat exchanger and coupled to the first pipe and a fifth pipe configured to circulate the first coolant heated by the heat exchanger from the heat exchanger to the chiller and coupled to the second pipe.

16. A cooling method for an electronic circuitry in cooling system including a chiller, a heat exchanger, a liquid immersion tank having an opening in a top thereof, a lid fitted into the opening, and a cooler, the method comprising:
    cooling a first coolant by the chiller;
    performing heat exchange between the first coolant and a second coolant, by the heat exchanger;
    immersing an electronic circuitry in the second coolant in the liquid immersion tank; and
    cooling a space between a liquid level of the second coolant and a lower surface of the lid that faces the liquid level, by the cooler, into which the first coolant cooled by the chiller is input through a first pipe coupled to the chiller, and from which the first coolant heated in the cooler is output to the chiller through a second pipe coupled to the chiller, the cooler being located between the liquid level of the second coolant and the lower surface of the lid that faces the liquid level in such a manner that a lower surface of the cooler covers the opening of the liquid immersion tank entirely.

17. The cooling method for an electronic circuitry according to claim 16, wherein the cooler is set to operate from before a predetermined time when the lid is opened.

18. The cooling method for an electronic circuitry according to claim 16, wherein the lid is set to be openable when the temperature of the space is below a predetermined temperature.

19. The cooling method according to claim 16, wherein the chiller includes a fourth pipe configured to circulate the first coolant cooled by the chiller from the chiller to the heat exchanger and coupled to the first pipe and a fifth pipe configured to circulate the first coolant heated by the heat exchanger from the heat exchanger to the chiller and coupled to the second pipe.

* * * * *